United States Patent
Choi et al.

(10) Patent No.: US 11,424,422 B2
(45) Date of Patent: Aug. 23, 2022

(54) DISPLAY DEVICE WITH OPENING PATTERN

(71) Applicant: Samsung Display Co., Ltd., Yongin-si (KR)

(72) Inventors: Junwon Choi, Yongin-si (KR); Wonkyu Kwak, Yongin-si (KR); Changsoo Pyon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/822,914

(22) Filed: Mar. 18, 2020

(65) Prior Publication Data
US 2021/0091320 A1    Mar. 25, 2021

(30) Foreign Application Priority Data

Sep. 24, 2019 (KR) .................. 10-2019-0117569

(51) Int. Cl.
| | | |
|---|---|---|
| *G06F 3/045* | (2006.01) | |
| *H01L 51/00* | (2006.01) | |
| *H01L 27/32* | (2006.01) | |
| *H01L 51/52* | (2006.01) | |
| *G06F 3/044* | (2006.01) | |
| *H01L 27/12* | (2006.01) | |

(52) U.S. Cl.
CPC ........ *H01L 51/0097* (2013.01); *G06F 3/0445* (2019.05); *H01L 27/323* (2013.01); *H01L 27/3248* (2013.01); *H01L 27/3258* (2013.01); *H01L 51/5253* (2013.01); *G06F 2203/04102* (2013.01); *H01L 27/1218* (2013.01); *H01L 27/1248* (2013.01)

(58) Field of Classification Search
CPC .............. H01L 51/0097; H01L 27/323; H01L 27/3248; G06F 3/0445
USPC ........................................... 345/174
See application file for complete search history.

(56) References Cited

U.S. PATENT DOCUMENTS

| | | |
|---|---|---|
| 9,276,055 B1 | 3/2016 | Son et al. |
| 9,616,644 B2 | 4/2017 | Kim et al. |
| 10,297,771 B2 | 5/2019 | Choi et al. |

(Continued)

FOREIGN PATENT DOCUMENTS

| | | |
|---|---|---|
| KR | 10-2015-0108481 | 9/2015 |
| KR | 10-2018-0123604 | 11/2018 |

(Continued)

*Primary Examiner* — Jonathan M Blancha
(74) *Attorney, Agent, or Firm* — Kile Park Reed & Houtteman PLLC

(57) ABSTRACT

A display device having improved reliability includes a substrate including a display area and a peripheral area outside the display area. The display area includes a central display area, a first bending display area contacting the central display area and bent about a first bending axis, and a second bending display area bent about a second bending axis intersecting the first bending axis. The peripheral area includes a corner area rounded and adjacent to the first bending display area and the second bending display area. This display device includes an inorganic layer disposed at the display area and the peripheral area, an opening pattern formed in the inorganic layer and corresponding to the corner area, and a first organic material layer covering the opening pattern.

19 Claims, 20 Drawing Sheets

(56) References Cited

U.S. PATENT DOCUMENTS

| | | | |
|---|---|---|---|
| 10,347,176 B2 | 7/2019 | Lee et al. | |
| 10,361,395 B2 | 7/2019 | Kajiyama | |
| 2010/0200869 A1* | 8/2010 | Sekiya | H01L 27/3246 257/88 |
| 2015/0171367 A1* | 6/2015 | Moon | H01L 51/5246 257/40 |
| 2016/0041436 A1* | 2/2016 | Igeta | G02F 1/1339 349/58 |
| 2018/0108863 A1* | 4/2018 | Kajiyama | H01L 27/3276 |
| 2018/0322848 A1* | 11/2018 | Wu | G09G 5/00 |
| 2019/0036068 A1* | 1/2019 | Kim | G06F 1/1641 |
| 2019/0131553 A1 | 5/2019 | Park et al. | |
| 2019/0148474 A1* | 5/2019 | Bu | H01L 27/3276 257/40 |
| 2019/0181363 A1* | 6/2019 | Lee | H01L 51/0097 |
| 2019/0181365 A1* | 6/2019 | Choi | H01L 51/56 |
| 2020/0176696 A1* | 6/2020 | Dai | H01L 27/3288 |

FOREIGN PATENT DOCUMENTS

| | | |
|---|---|---|
| KR | 10-2019-0000374 | 1/2019 |
| KR | 10-1970068 | 4/2019 |
| KR | 10-2019-0048825 | 5/2019 |

* cited by examiner

DISPLAY DEVICE WITH OPENING PATTERN

CROSS-REFERENCE TO RELATED APPLICATION

This application claims priority to and benefits of Korean Patent Application No. 10-2019-0117569 under 35 U.S.C. § 119, filed in the Korean Intellectual Property Office on Sep. 24, 2019, the entire contents of which are incorporated herein by reference.

BACKGROUND

1. Field

One or more embodiments relate to a display device having improved reliability.

2. Description of Related Art

Among display devices, organic light-emitting display devices have been highlighted as next-generation display devices due to their wide viewing angles, high contrast, and fast response speeds.

In general, an organic light-emitting display device may be formed with thin-film transistors and organic light-emitting diodes arranged on a substrate, and may operate through the organic light-emitting diodes which may themselves emit light. An organic light-emitting display device may be used as a display in various products ranging from a small-sized product such as a mobile phone to a large-sized product such as a television.

A display device such as an organic light-emitting display device may include a display on a substrate. By bending at least part of a display device, visibility from various angles may be improved and/or the area of a non-display area may be reduced.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments may include a display device having improved reliability by preventing propagation of cracks. However, the above aspect is exemplary and the scope of the disclosure is not limited thereto.

Additional aspects will be set forth in part in the description which follows and, in part, will be apparent from the description, or may be learned by practice of the presented embodiments of the disclosure.

According to one or more embodiments, a display device may include a substrate including a display area and a peripheral area outside the display area. The display area may include a central display area, a first bending display area contacting the central display area and bent about a first bending axis, and a second bending display area bent about a second bending axis intersecting the first bending axis. The peripheral area may include a corner area rounded and adjacent to the first bending display area and the second bending display area. This display device may include an inorganic layer disposed at the display area and the peripheral area, an opening pattern formed in the inorganic layer and corresponding to the corner area, and a first organic material layer covering the opening pattern.

A portion of the inorganic layer may be removed to form the opening pattern.

The opening pattern may have a slit structure corresponding to the corner area.

The opening pattern may have a grating structure corresponding to the corner area.

The first organic material layer may be directly on a portion of the substrate from which the portion of the inorganic layer is removed.

The display device may further include an insulating layer disposed on the inorganic layer and corresponding to the corner area.

The display device may further include thin-film transistors on the inorganic layer at the central display area, the first bending display area, and the second bending display area, and display elements electrically connected to the thin-film transistors.

The display device may further include a first planarization layer disposed on the thin-film transistors, and a second planarization disposed on the first planarization layer.

The first organic material layer and the second planarization layer may include a same material.

The display device may further include a thin-film encapsulation layer disposed on the display elements, the thin-film encapsulation layer including an inorganic encapsulation layer and an organic encapsulation layer.

The display device may further include a touch part on the thin-film encapsulation layer, wherein the touch part may include a first touch insulating layer, a first conductive layer on the first touch insulating layer, a second conductive layer on the first conductive layer, a second touch insulating layer between the first conductive layer and the second conductive layer, and a second organic material layer on the second conductive layer.

The second organic material layer may extend to the corner area and may cover the first organic material layer.

The display device may further include a first dam portion corresponding to the corner area, the first dam portion surrounding the opening pattern.

The substrate may further include a third bending display area contacting the central display area and bent about a third bending axis.

The substrate may further include a fourth bending display area contacting the central display area and bent about a fourth bending axis.

According to one or more embodiments, a display device may include a flexible substrate including a display area and a peripheral area outside the display area. The display device may include an inorganic layer on the flexible substrate, an opening pattern formed in the inorganic layer and corresponding to the peripheral area, an insulating layer disposed on the inorganic layer and corresponding to the peripheral area, and a first organic material layer disposed on the flexible substrate and covering the opening pattern.

A portion of the inorganic layer may be removed to form the opening pattern.

The opening pattern may have a slit structure corresponding to the peripheral area.

The opening pattern may have a grating structure corresponding to the peripheral area.

The first organic material layer may be directly on a portion of the flexible substrate from which the portion of the inorganic layer may be removed.

The display device may further include thin-film transistors over the flexible substrate, a first planarization layer disposed on the thin-film transistors, and a second planarization layer on the first planarization layer.

The first organic material layer and the second planarization layer may include a same material.

According to one or more embodiments, a display device may include a substrate including a display area, a first bending area contacting the display area and bent about a first bending axis, a second bending area bent about a second bending axis intersecting with the first bending axis, and a peripheral area outside the display area and including a corner area rounded and adjacent to the first bending area and the second bending area. The display device may include an inorganic layer disposed at the display area and the peripheral area, an opening pattern formed in the inorganic layer and corresponding to the corner area, and a first organic material layer covering the opening pattern.

A portion of the inorganic layer may be removed to form the opening pattern.

The opening pattern may have a slit structure corresponding to the corner area.

The opening pattern may have a grating structure corresponding to the corner area.

The first organic material layer may be directly on a portion of the substrate from which the portion of the inorganic layer may be removed.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
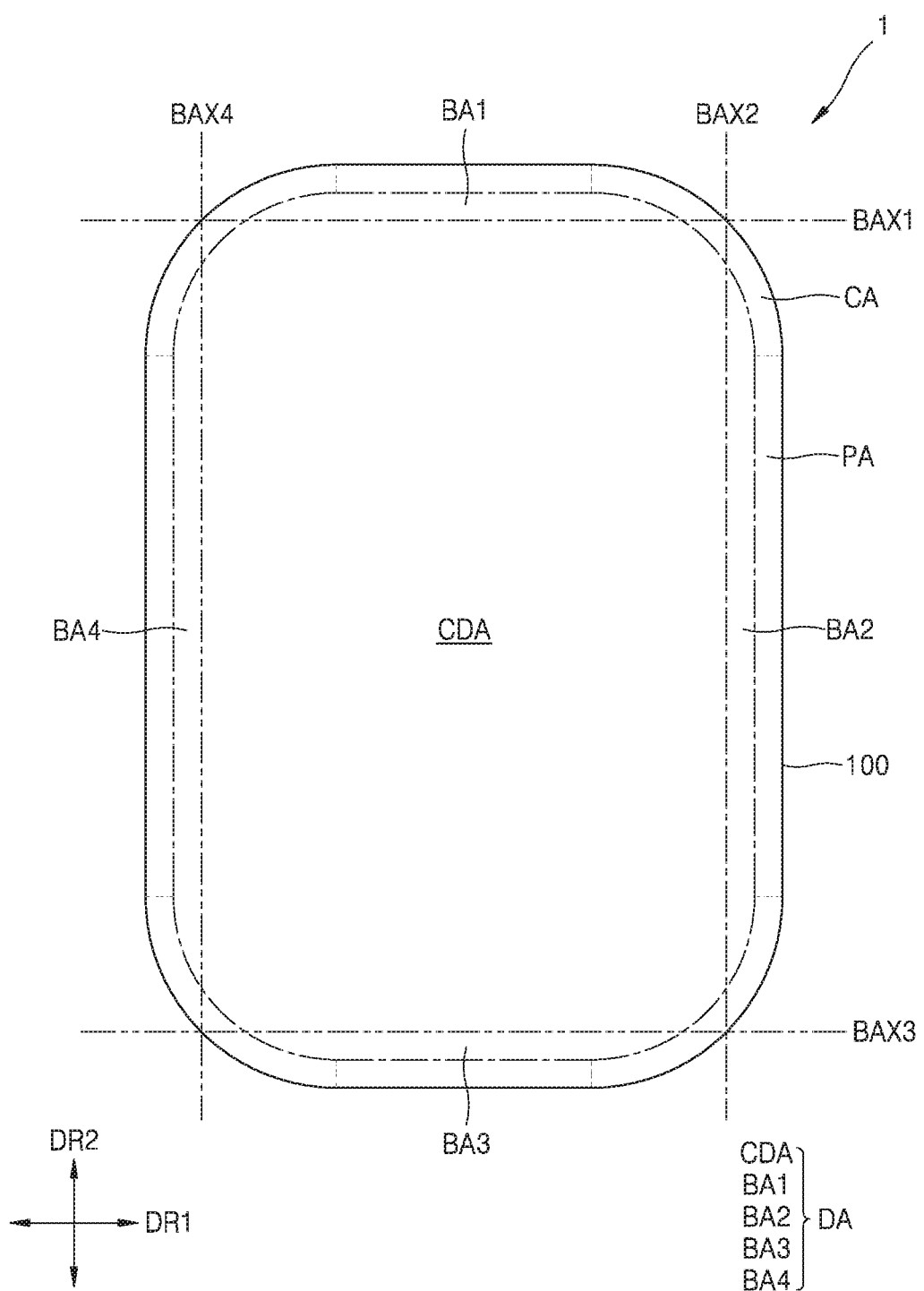
FIGS. 1 and 2 are schematic plan views of a display device according to an embodiment.

Reference will now be made in detail to embodiments, examples of which are illustrated in the accompanying drawings, wherein like reference numerals refer to like elements throughout. Redundant explanations of like elements may be omitted in the interest of brevity. Embodiments may have different forms than those shown, and should not be construed as being limited to the descriptions set forth herein. Accordingly, the embodiments are merely described below, by referring to the figures, to explain aspects of the description. As used herein, the term "and/or" includes any and all combinations of one or more of the associated listed items. The terms "and" and "or" may be used in the conjunctive or disjunctive sense and may be understood to be equivalent to "and/or." Throughout the disclosure, the expression "at least one of a, b and c" indicates only a, only b, only c, both a and b, both a and c, both b and c, all of a, b, and c, or variations thereof.

While such terms as "first," "second," and the like, may be used to describe various components, such components are not be limited to the above terms. Rather, these terms are used only to distinguish one component from another. An expression used in the singular encompasses the expression of the plural, unless it has a clearly different meaning in the context.

It will be further understood that the terms "comprises", "comprising", "includes", "including", "has", "have", "having", and the like used herein specify the presence of stated features or components, but do not preclude the presence or addition of one or more other features or components. It will be understood that when a layer, region, or component is referred to as being "formed on", "over", "under" or the like with respect to another layer, region, or component, it can be directly or indirectly formed on the other layer, region, or component. For example, intervening layers, regions, or components may be present.

Spatially relative terms, such as "beneath", "below", "lower", "above", and "upper", may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Sizes of components in the drawings may be exaggerated for convenience of explanation. In other words, since sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

The terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element.

The expression "not overlap" may include "apart from" or "set aside from" or "offset from" and any other suitable equivalents as would be appreciated and understood by those of ordinary skill in the art.

When a certain embodiment may be implemented differently, a specific process order may be performed differently from the described order. For example, two consecutively described processes may be performed substantially at the same time or performed in an order opposite to the described order.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
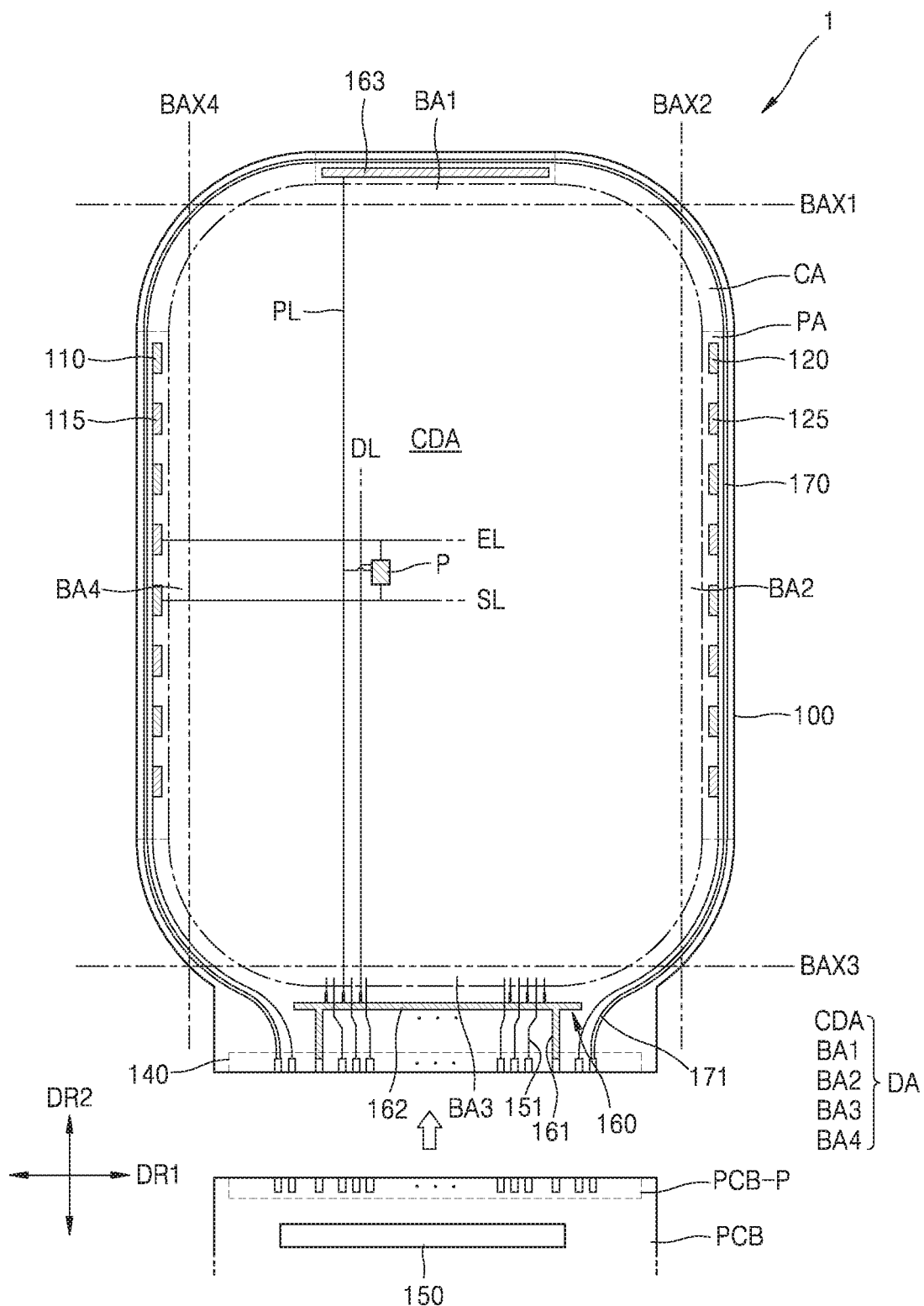

FIG. 1 and FIG. 2 are schematic plan views of a display device 1 according to an embodiment.

Referring to FIG. 1, the display device 1 may include a display area DA that may display images, and a peripheral area PA on an outer portion of the display area DA, wherein the peripheral area PA may not display images. The display device 1 may provide images by using light emitted from pixels P (See, e.g., FIG. 2) in the display area DA. The peripheral area PA may not display images.

The display area DA may include a central display area CDA, a first bending display area BA1 that may be in contact with the central display area CDA and may be bent about a first bending axis BAX1 extending in a first direction DR1, a second bending display area BA2 that may be in contact with the central display area CDA and may be bent about a second bending axis BAX2 extending in a second direction DR2 that intersects with the first direction DR1, a third bending display area BA3 that may be in contact with the central display area CDA and may be bent about a third bending axis BAX3 extending in the first direction DR1, and a fourth bending display area BA4 that may be in contact with the central display area CDA and may be bent about a fourth bending axis BAX4 extending in the second direction DR2. The peripheral area PA may include corner areas CA respectively adjacent to the first bending display area BA1 and the second bending display area BA2, to the second bending display area BA2 and the third bending display area BA3, to the third bending display area BA3 and the fourth bending display area BA4, and to the fourth bending display area BA4 and the first bending display area BA1.

The first bending display area BA1, the second bending display area BA2, the third bending display area BA3, and the fourth bending display area BA4 may be bent with respect to the central display area CDA to display images to different directions from one another.

In an embodiment, the display device 1 may include a first bending area corresponding to the first bending display area BA1, a second bending area corresponding to the second bending display area BA2, a third bending area corresponding to the third bending display area BA3, and a fourth bending area corresponding to the fourth bending display area BA4. Pixels P may not be in the first bending area, the second bending area, the third bending area, and the fourth bending area, like in the peripheral area PA. The first bending area, the second bending area, the third bending area, and the fourth bending area may not display images.

The display device 1 including a bending type display surface is shown according to an embodiment, but embodiments are not limited thereto. For example, a display device 2 may include a flat display surface as described with reference to FIG. 9 below.

The display device 1 according to an embodiment may be flexible. However, embodiments are not limited thereto. For example, the display device 1 may be rigid. In an embodiment, the display device 1 may be applied in a mobile terminal as shown. Although not shown in FIG. 1, a mobile terminal may be configured by arranging electronic parts, a camera, a power source, and the like mounted on a main board in a bracket/case together with the display device 1. A display device 1 according to an embodiment may be applied in a variety of products ranging from a large-sized electronic apparatus such as a television, a monitor, or the like, to a small-medium size electronic apparatus such as a tablet terminal, a car navigation system, a game console, a smart watch, or the like.

Referring to FIG. 2, the display device 1 may include the pixels P in the central display area CDA. Each of the pixels P may include a display element such as an organic light-emitting diode (OLED). Each of the pixels P may emit light, e.g., red light, green light, blue light, or white light, from the organic light-emitting diode.

The display device 1 may include the pixels P in the first bending display area BA1, the second bending display area BA2, the third bending display area BA3, and the fourth bending display area BA4. Pixels P in the first bending display area BA1, the second bending display area BA2, the third bending display area BA3, and the fourth bending display area BA4 may emit light, e.g., red light, green light, blue light, or white light from an organic light-emitting diode OLED.

The central display area CDA, the first bending display area BA1, the second bending display area BA2, the third bending display area BA3, and the fourth bending display area BA4 may be covered by a thin film encapsulation layer TFE (see FIG. 5B) to be protected against external air and moisture.

In an embodiment, the pixels P may not be in the first bending area corresponding to the first bending display area BA1, the second bending area corresponding to the second bending display area BA2, the third bending area corresponding to the third bending display area BA3, and the fourth bending area corresponding to the fourth bending display area BA4.

Pixels P may be electrically connected to external circuits in the peripheral area PA. The peripheral area PA may include a first scan driving circuit 110, a first emission driving circuit 115, a second scan driving circuit 120, a second emission driving circuit 125, a pad portion 140, a data driving circuit 150, a first power supply line 160, and a second power supply line 170.

The first scan driving circuit 110 may provide each pixel P with a scan signal via a scan line SL. The first emission driving circuit 115 may provide each of the pixels P with an emission control signal via an emission control line EL. The second scan driving circuit 120 may be in parallel with the first scan driving circuit 110. The central display area CDA, the second bending display area BA2, and the fourth bending display area BA4 may be between the second scan driving circuit 120 and the first scan driving circuit 110. The second emission driving circuit 125 may be in parallel with the first emission driving circuit 115. The central display area CDA, the second bending display area BA2, and the fourth bending display area BA4 may be between the second emission driving circuit 125 and the first emission driving circuit 115. Some of the pixels P in the central display area CDA, the first bending display area BA1, the second bending display area BA2, the third bending display area BA3, and the fourth bending display area BA4 may be electrically connected to the first scan driving circuit 110, and others may be connected to the second scan driving circuit 120. Some of the pixels P in the central display area CDA, the first bending display area BA1, the second bending display area BA2, the third bending display area BA3, and the fourth bending display area BA4 may be electrically connected to the first emission driving circuit 115, and others may be connected to the second emission driving circuit 125.

FIG. 2 shows that the first scan driving circuit 110 and the first emission driving circuit 115 may be arranged alternately with each other in the second direction DR2, but the embodiments are not limited thereto. For example, the first emission driving circuit 115 may be apart from the first scan driving circuit 110 in the first direction DR1.

The pad portion 140 may be at a side of the substrate 100. The pad portion 140 may not be covered by an insulating layer but may be exposed, and may be electrically connected to a printed circuit board PCB. A pad portion PCB-P of the printed circuit board PCB may be electrically connected to the pad portion 140 of the display device 1. The printed circuit board PCB may transfer a signal and/or power from a controller (not shown) to the display device 1.

A control signal generated by the controller may be respectively transferred to the first and second scan driving circuits 110 and 120 via the printed circuit board PCB. The controller may provide the first and second power supply lines 160 and 170 respectively with a first power voltage ELVDD and a second power voltage ELVSS (see FIG. 4) via first and second connecting lines 161 and 171. The first power voltage ELVDD may be supplied to each pixel P via a lower driving voltage line PL connected to the first power supply line 160, and the second power voltage ELVSS may be provided to an opposite electrode of each pixel P connected to the second power supply line 170.

The data driving circuit 150 may be electrically connected to a data line DL. A data signal of the data driving circuit 150 may be provided to each of the pixels P via a connecting line 151 connected to the pad portion 140 and a data line DL connected to the connecting line 151. Although FIG. 2 shows that the data driving circuit 150 may be on the printed circuit board PCB, embodiments are not limited thereto. For example, the data driving circuit 150 may be on the substrate 100 in another embodiment. The data driving circuit 150 may be between the pad portion 140 and the first power supply line 160.

The first power supply line 160 may include a first sub-line 162 and a second sub-line 163 extending in parallel with each other in the first direction DR1. The central display area CDA, the first bending display area BA1, and the third bending display area BA3 may be between the first sub-line 162 and the second sub-line 163. The second power supply line 170 may have a loop shape having an open side and may surround (e.g., partially surround) the central display area CDA.

Figure 3:
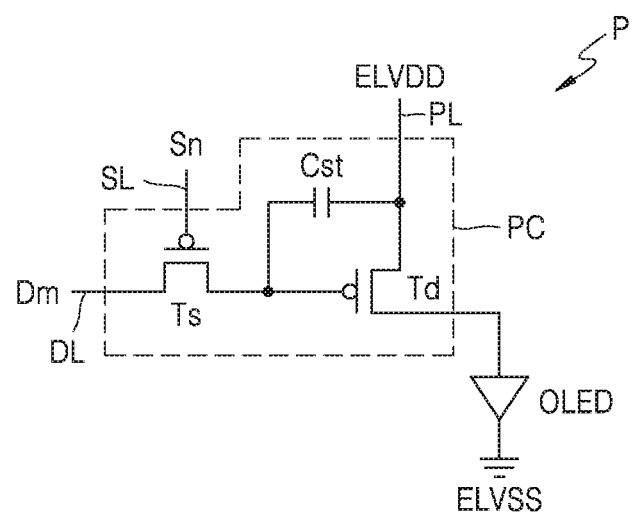
FIGS. 3 and 4 are equivalent circuit diagrams of a pixel that may be included in a display device according to an embodiment.
Figure 4:
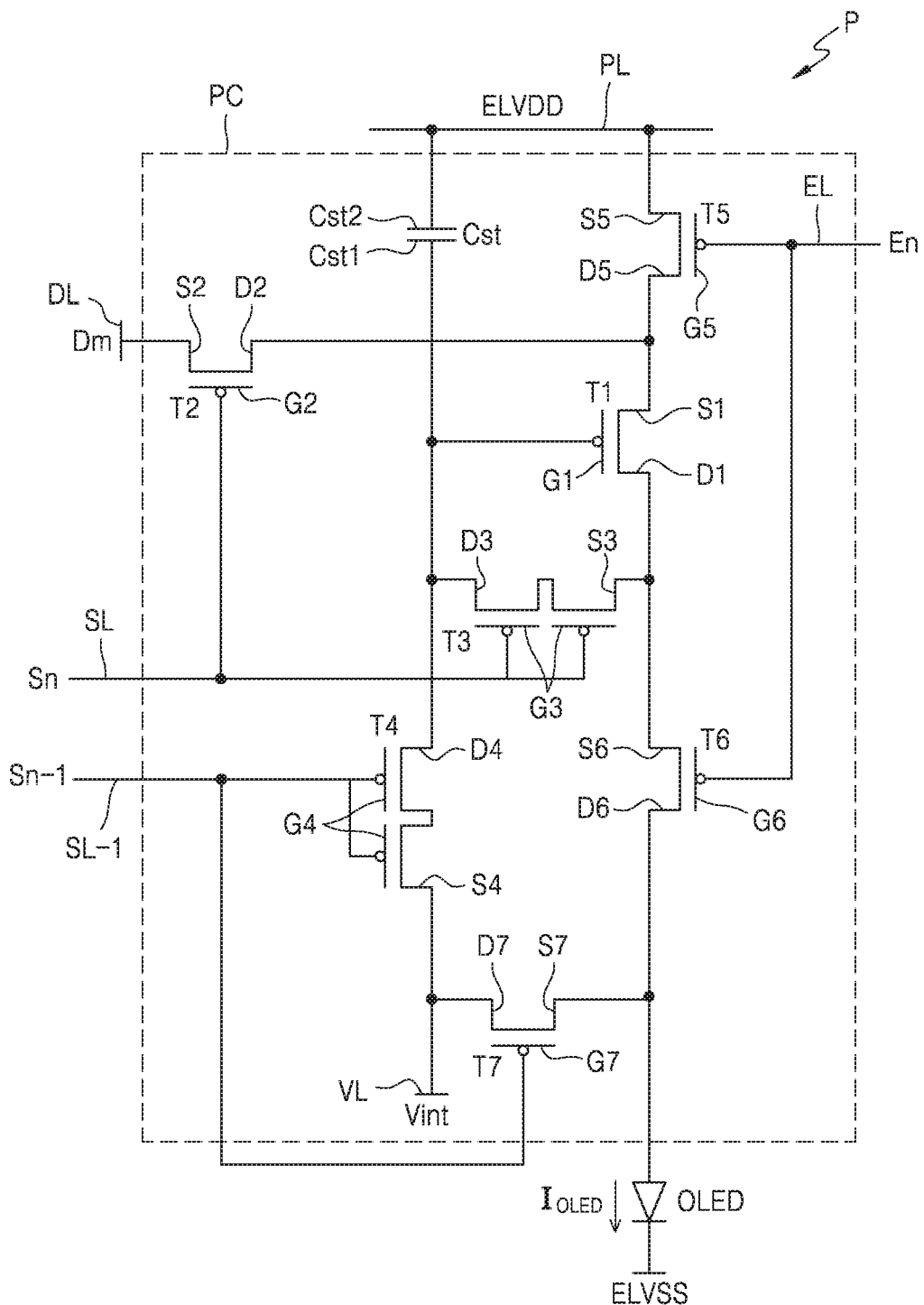

FIGS. 3 and 4 are equivalent circuit diagrams of a pixel P that may be included in a display device according to an embodiment.

Referring to FIG. 3, each pixel P may include a pixel circuit PC connected to a scan line SL and a data line DL, and an organic light-emitting diode OLED connected to the pixel circuit PC. The pixel circuit PC may include a driving thin-film transistor Td, a switching thin-film transistor Ts, and a storage capacitor Cst. The switching thin-film transistor Ts may be connected to the scan line SL and the data line DL and may transfer a data signal Dm input through the data line DL to the driving thin-film transistor Td according to a scan signal Sn input through the scan line SL.

The storage capacitor Cst may be connected to the switching thin-film transistor Ts and a lower driving voltage line PL and may store a voltage corresponding to a difference between a voltage transferred from the switching thin-film transistor Ts and the first power voltage ELVDD (or driving voltage) supplied to the lower driving voltage line PL.

The driving thin-film transistor Td may be connected to the lower driving voltage line PL and the storage capacitor Cst and may control a driving current flowing from the lower driving voltage line PL to the organic light-emitting diode OLED in response to the voltage value stored in the storage capacitor Cst. The organic light-emitting diode OLED may emit light having a certain luminance according to the driving current.

FIG. 3 shows an example in which the pixel circuit PC includes two thin-film transistors and one storage capacitor, but embodiments are not limited thereto. For example, a pixel circuit PC may include seven thin-film transistors and one storage capacitor as shown in FIG. 4. In FIG. 4, the pixel circuit PC includes one storage capacitor, but the pixel circuit PC may include two or more storage capacitors.

Referring to FIG. 4, a pixel P may include the pixel circuit PC and an organic light-emitting diode OLED connected to the pixel circuit PC. The pixel circuit PC may include thin-film transistors and a storage capacitor. The thin-film transistors and the storage capacitor may be connected to signal lines SL, SL-1, EL, and DL, an initialization voltage line VL, and a lower driving voltage line PL.

In FIG. 4, each pixel P may be connected to the signal lines SL, SL-1, EL, and DL, the initialization voltage line VL, and the lower driving voltage line PL, but embodiments are not limited thereto. For example, at least one of the signal lines SL, SL-1, EL, and DL, the initialization voltage line VL, and the lower driving voltage line PL may be shared by neighboring pixels.

The signal lines may include the scan line SL transferring a scan signal Sn, a previous scan line SL-1 transferring a previous scan signal Sn-1 to the first initialization thin-film transistor T4 and the second initialization thin-film transistor T7, an emission control line EL transferring an emission control signal En to the operation control thin-film transistor T5 and the emission control thin-film transistor T6, and a data line DL intersecting with the scan line SL and transferring a data signal Dm. The lower driving voltage line PL may transfer the driving voltage ELVDD to the driving thin-film transistor T1, and the initialization voltage line VL may transfer an initialization voltage Vint for initializing the driving thin-film transistor T1 and the pixel electrode.

A driving gate electrode G1 of the driving thin-film transistor T1 may be connected to a lower electrode Cst1 of the storage capacitor Cst, a driving source electrode S1 of the driving thin-film transistor T1 may be connected to the lower driving voltage line PL via the operation control thin-film transistor T5, and a driving drain electrode D1 of the driving thin-film transistor T1 may be electrically connected to a pixel electrode of the organic light-emitting diode OLED via the emission control thin-film transistor T6. The driving thin-film transistor T1 receives the data signal Dm according to a switching operation of the switching thin-film transistor T2 to supply a driving current $I_{OLED}$ to the organic light-emitting diode OLED.

A switching gate electrode G2 of the switching thin-film transistor T2 may be connected to the scan line SL, a switching source electrode S2 of the switching thin-film transistor T2 may be connected to the data line DL, a switching drain electrode D2 of the switching thin-film transistor T2 may be connected to the driving source electrode S1 of the driving thin-film transistor T1 and also may be connected to the lower driving voltage line PL via the operation control thin-film transistor T5. The switching thin-film transistor T2 may be turned on according to the scan signal Sn received through the scan line SL and may perform a switching operation that transfers the data signal Dm transferred through the data line DL to the driving source electrode S1 of the driving thin-film transistor T1.

A compensation gate electrode G3 of the compensation thin-film transistor T3 may be connected to the scan line SL, a compensation source electrode S3 of the compensation thin-film transistor T3 may be connected to the driving drain electrode D1 of the driving thin-film transistor T1 and also may be connected to the pixel electrode of the organic light-emitting diode OLED via the emission control thin-film transistor T6, and a compensation drain electrode D3 of the compensation thin-film transistor T3 may be connected to the lower electrode Cst1 of the storage capacitor Cst, a first initialization drain electrode D4 of the first initialization thin-film transistor T4, and the driving gate electrode G1 of the driving thin-film transistor T1. The compensation thin-film transistor T3 may be turned on according to the scan signal Sn received through the scan line SL to electrically connect the driving gate electrode G1 and the driving drain electrode D1 of the driving thin-film transistor T1 to each other and to diode-connect the driving thin-film transistor T1.

A first initialization gate electrode G4 of the first initialization thin-film transistor T4 may be connected to the previous scan line SL-1, a first initialization source electrode S4 of the first initialization thin-film transistor T4 may be connected to a second initialization drain electrode D7 of the second initialization thin-film transistor T7 and the initialization voltage line VL, and the first initialization drain electrode D4 of the first initialization thin-film transistor T4 may be connected to the lower electrode Cst1 of the storage capacitor Cst, the compensation drain electrode D3 of the compensation thin-film transistor T3, and the driving gate electrode GE1 of the driving thin-film transistor T1. The first initialization thin-film transistor T4 may be turned on according to a previous scan signal Sn-1 transferred through the previous scan line SL-1 to transfer the initialization voltage Vint to the driving gate electrode G1 of the driving thin-film transistor T1 and perform an initialization operation for initializing a voltage at the driving gate electrode G1 of the driving thin-film transistor T1.

An operation control gate electrode G5 of the operation control thin-film transistor T5 may be connected to the emission control line EL, an operation control source electrode S5 of the operation control thin-film transistor T5 may be connected to the lower driving voltage line PL, and an operation control drain electrode D5 of the operation control thin-film transistor T5 may be connected to the driving source electrode S1 of the driving thin-film transistor T1 and the switching drain electrode D2 of the switching thin-film transistor T2.

An emission control gate electrode G6 of the emission control thin-film transistor T6 may be connected to the emission control line EL, an emission control source electrode S6 of the emission control thin-film transistor T6 may be connected to the driving drain electrode D1 of the driving thin-film transistor T1 and the compensation source electrode S3 of the compensation thin-film transistor T3, and an emission control drain electrode D6 of the emission control thin-film transistor T6 may be electrically connected to a second initialization source electrode S7 of the second initialization thin-film transistor T7 and the pixel electrode of the organic light-emitting diode OLED.

The operation control thin-film transistor T5 and the emission control thin-film transistor T6 may be turned on (e.g., simultaneously turned on) according to the emission control signal En transferred through the emission control line EL to transfer the driving voltage ELVDD to the organic light-emitting diode OLED and to allow the driving current $I_{OLED}$ to flow in the organic light-emitting diode OLED.

The second initialization gate electrode G7 of the second initialization thin-film transistor T7 may be connected to the previous scan line SL-1, a second initialization source electrode S7 of the second initialization thin-film transistor T7 may be connected to the emission control drain electrode D6 of the emission control thin-film transistor T6 and the pixel electrode of the organic light-emitting diode OLED, and a second initialization drain electrode D7 of the second initialization thin-film transistor T7 may be connected to the first initialization source electrode S4 of the first initialization thin-film transistor T4 and the initialization voltage line VL. The second initialization thin-film transistor T7 may be turned on according to the previous scan signal Sn-1 transferred through the previous scan line SL-1 to initialize the pixel electrode of the organic light-emitting diode OLED.

FIG. 4 shows a case in which the first initialization thin-film transistor T4 and the second initialization thin-film transistor T7 may be connected to the previous scan line SL-1, but embodiments are not limited thereto. For example, the first initialization thin-film transistor T4 may be connected to the previous scan line SL-1 to operate according to the previous scan signal Sn-1, and the second initialization thin-film transistor T7 may be connected to a separate signal line (e.g., a post scan line) to operate according to a signal transferred to the separate signal line.

An upper electrode Cst2 of the storage capacitor Cst may be connected to the lower driving voltage line PL, and an opposite electrode of the organic light-emitting diode OLED may be connected to the common voltage ELVSS. Accordingly, the organic light-emitting diode OLED emits light by receiving the driving current $I_{OLED}$ from the driving thin-film transistor T1 to display images.

In FIG. 4, the compensation thin-film transistor T3 and the first initialization thin-film transistor T4 may have dual-gate electrodes, but the compensation thin-film transistor T3 and the first initialization thin-film transistor T4 may each have one gate electrode.

Figure 5A:
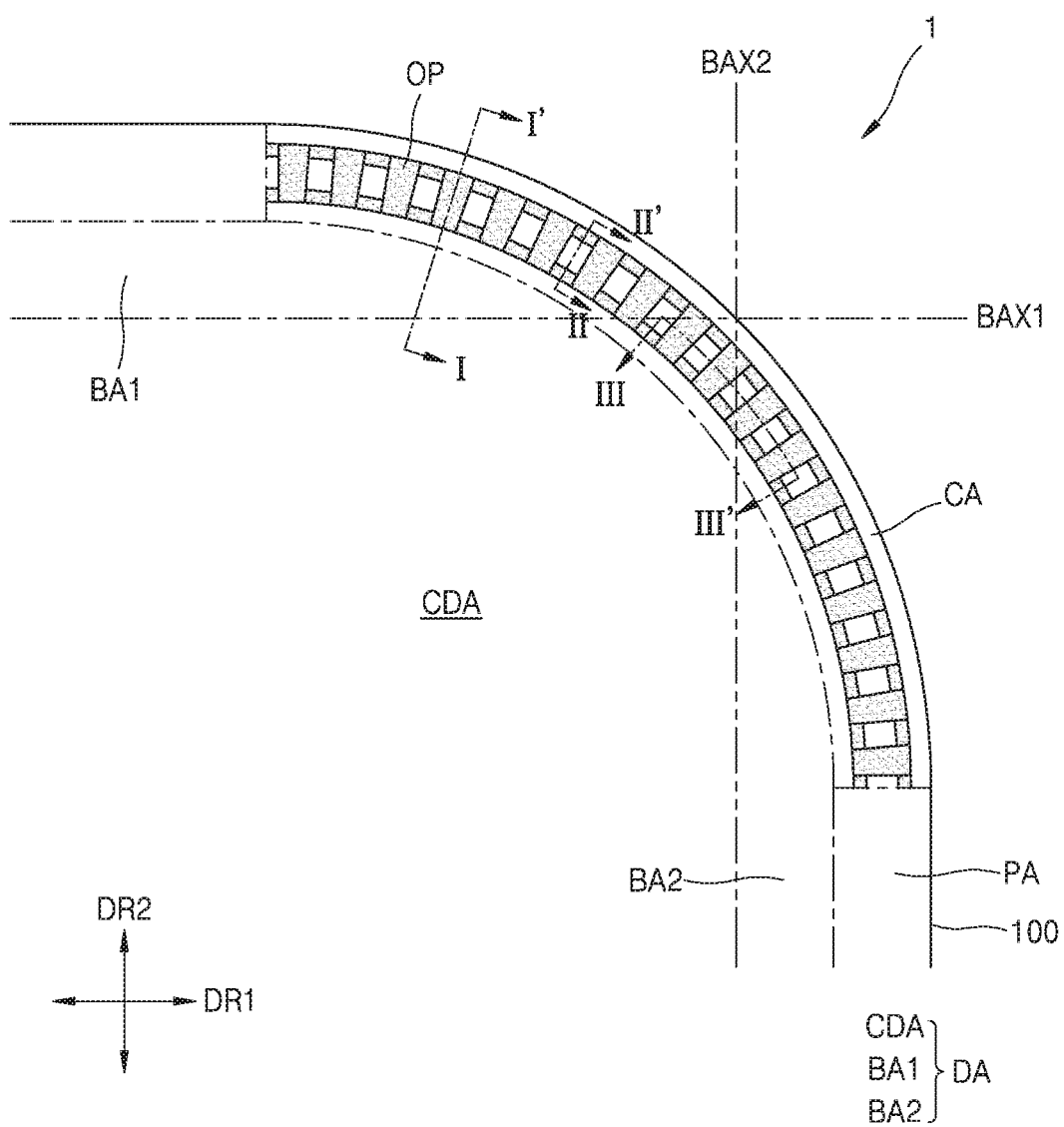
FIGS. 5A to 5D are schematic diagrams illustrating part of a display device according to an embodiment.
Figure 5B:
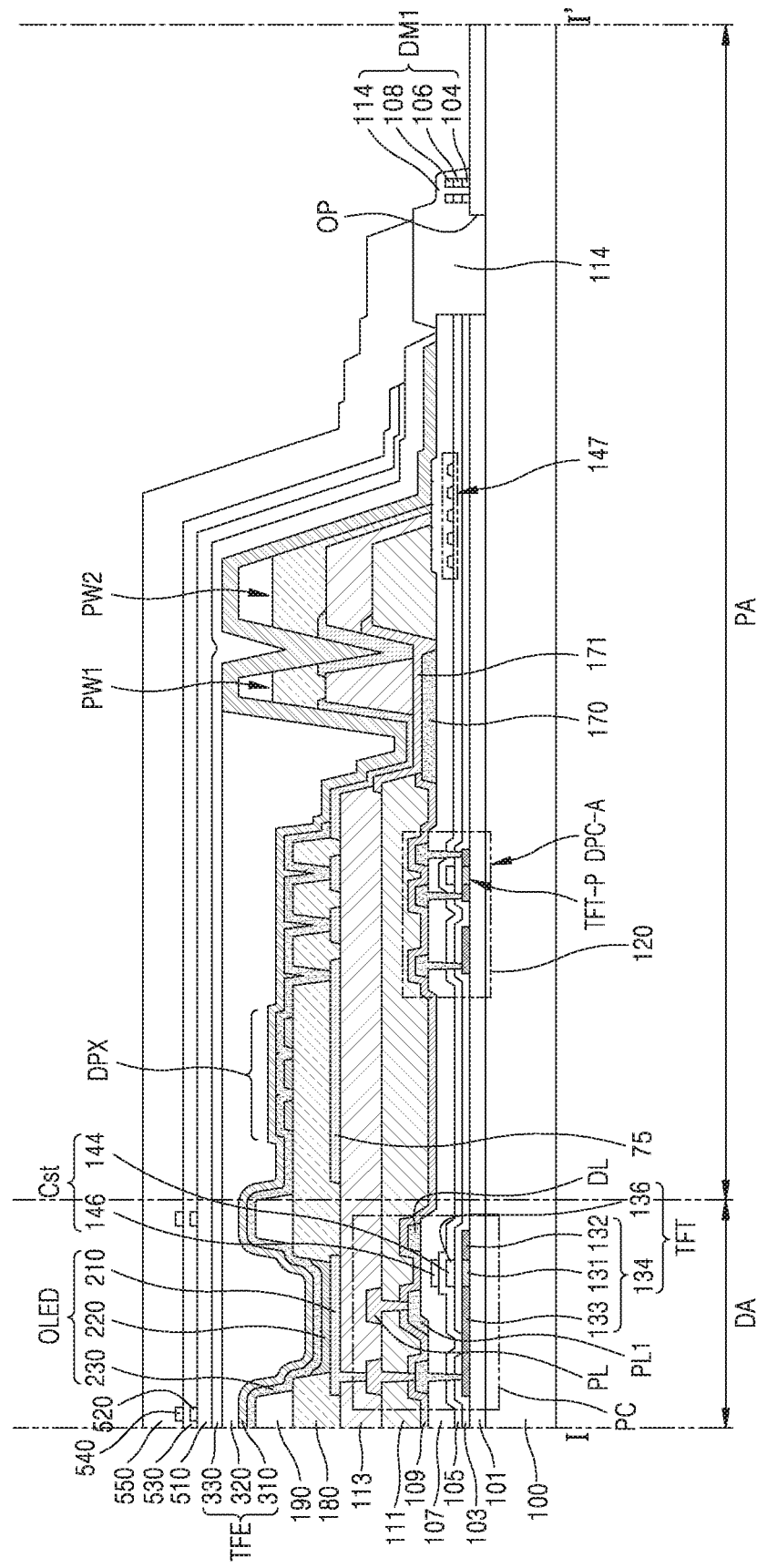
Figure 5C:
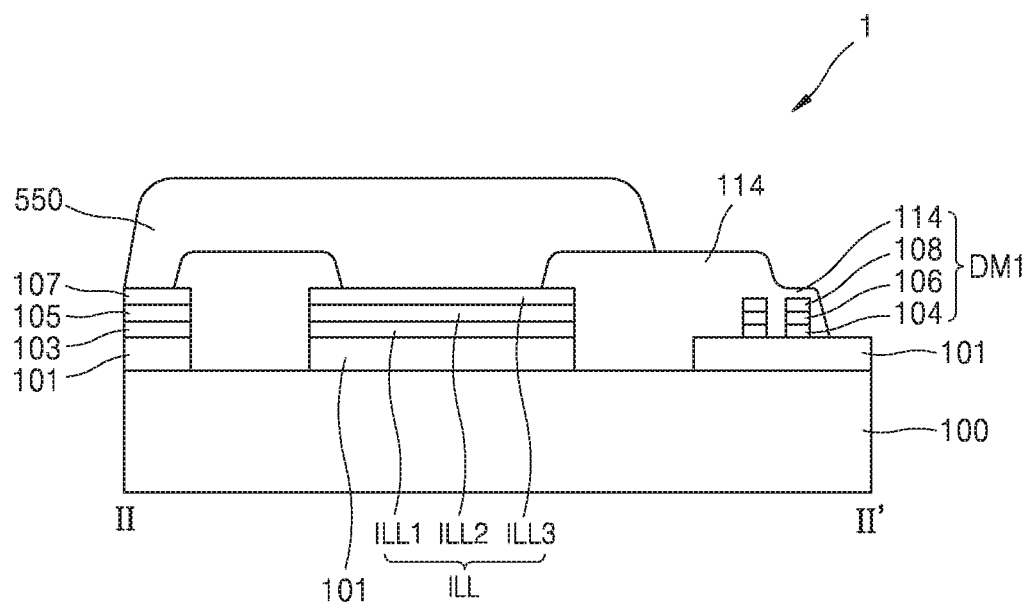
Figure 5D:
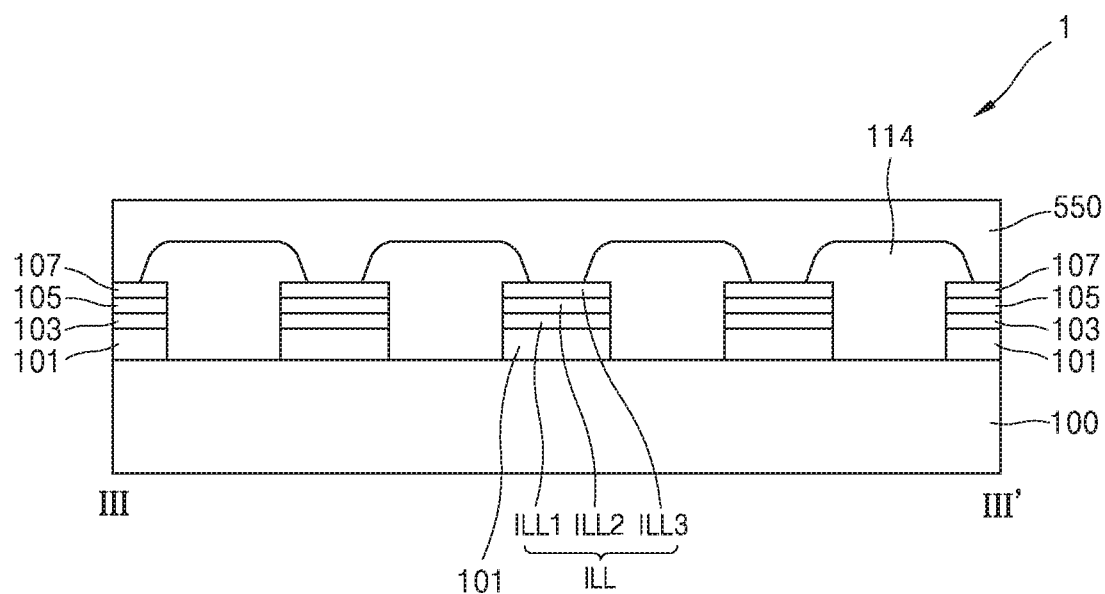

FIGS. 5A to 5D are schematic diagrams illustrating part of a display device 1 according to an embodiment. In more detail, FIG. 5A is a schematic enlarged view of the corner area CA of the display device 1, FIG. 5B is a schematic cross-sectional view of the display device 1 taken along line I-I' of FIG. 5A, FIG. 5C is a schematic cross-sectional view of the display device 1 taken along line II-II' of FIG. 5A, and FIG. 5D is a schematic cross-sectional view of the display device 1 taken along line III-III' of FIG. 5A.

Referring to FIGS. 5A and 5B, the substrate 100 of the display device 1 according to an embodiment may include the display area DA and the peripheral area PA on the outer portion of the display area DA. The display area DA may include the central display area CDA. The display area DA may include the first bending display area BA1 that may be in contact with the central display area CDA and may be bent about the first bending axis BAX1. The display area DA may include the second bending display area BA2 bent about the second bending axis BAX2 intersecting with the first bending axis BAX1. The peripheral area PA may include the corner area CA that may be rounded and adjacent to the first bending display area BA1 and the second bending display area BA2.

The substrate 100 may include glass or a polymer resin. The polymer resin may include, e.g., polyethersulfone, polyacrylate, polyether imide, polyethylene naphthalate, polyethylene terephthalate, polyphenylene sulfide, polyarylate, polyimide, polycarbonate, cellulose acetate propionate, or a combination thereof. The substrate 100 including the polymer resin may be flexible, rollable, or bendable. The substrate 100 may have a multi-layered structure including a layer including the polymer resin and an inorganic layer (not shown). In an embodiment, the substrate 100 may include a flexible substrate.

An inorganic layer 101 may be on the substrate 100 to reduce or block infiltration of impurities, moisture, or external air from a lower portion of the substrate 100, and to provide a flat surface on the substrate 100. The inorganic layer 101 may include an inorganic material such as an oxide material or a nitride material. A barrier layer (not shown) for preventing infiltration of external air may be further provided between the substrate 100 and the inorganic layer 101. The display device may include an opening pattern OP formed in the inorganic layer 101. For example, the inorganic layer 101 may include opening pattern OP that may be provided throughout the display area DA and the peripheral area PA. The opening pattern may correspond to the corner area CA. At least part of the inorganic layer 101 may be removed to correspond to the corner area CA.

A thin-film transistor TFT corresponding to the display area DA, a storage capacitor Cst, and a display device electrically connected to the thin-film transistor TFT and the storage capacitor Cst may be over the substrate 100. The thin-film transistor TFT of FIG. 5B may include one of the thin-film transistors included in the pixel circuit PC described above with reference to FIG. 4, e.g., the driving thin-film transistor T1.

The thin-film transistor TFT may include a semiconductor layer 134 and a gate electrode 136. The semiconductor layer 134 may include, for example, polysilicon. The semiconductor layer 134 may include a channel region 131 overlapping the gate electrode 136. The semiconductor layer 134 may include a source region 132 and a drain region 133 at opposite sides of the channel region 131. The source region 132 and the drain region 133 may include impurities of higher concentration than that of the channel region 131. Here, the impurities may include N-type impurities or P-type impurities. The source region 132 and the drain region 133 may be appreciated as a source electrode and a drain electrode of the thin-film transistor TFT.

The semiconductor layer 134 may include an oxide semiconductor and/or a silicon semiconductor. In case that the semiconductor layer 134 includes an oxide semiconductor, the semiconductor layer 134 may include an oxide material of at least one selected from the group consisting of, for example, indium (In), gallium (Ga), stannum (Sn), zirconium (Zr), vanadium (V), hafnium (Hf), cadmium (Cd), germanium (Ge), chrome (Cr), titanium (Ti), and zinc (Zn). For example, the semiconductor layer 134 may include ITZO (InSnZnO), IGZO (InGaZnO), or the like. In case that the semiconductor layer 134 includes a silicon semiconductor, the semiconductor layer 134 may include, for example, amorphous silicon (a-Si) or low temperature poly-silicon (LPTS) obtained by crystallizing a-Si.

The gate electrode 136 may have a single or multi-layered structure including one or more metal selected from aluminum (Al), platinum (Pt), palladium (Pd), argentum (Ag), magnesium (Mg), aurum (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 136 may be connected to a gate line that may apply an electrical signal to the gate electrode 136.

A gate insulating layer 103 may be between the semiconductor layer 134 and the gate electrode 136. The gate insulating layer 103 may include at least one inorganic insulating material selected from the group consisting of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The gate insulating layer 103 may have a single-layered or a multi-layered structure including the inorganic insulating material.

The storage capacitor Cst may include a lower electrode 144 and an upper electrode 146 overlapping each other. A first interlayer insulating layer 105 may be between the lower electrode 144 and the upper electrode 146. The first interlayer insulating layer 105 may have a certain permittivity and may include an inorganic insulating layer such as SiON, $SiO_x$, and/or $SiN_x$ in a single-layered or multi-layered structure.

FIG. 5B shows a case in which the storage capacitor Cst overlaps the thin-film transistor TFT and the lower electrode 144 may be integral with the gate electrode 136 of the thin-film transistor TFT. In an embodiment, the storage capacitor Cst may not overlap the thin-film transistor TFT and the lower electrode 144 may be an independent element separate from the gate electrode 136 of the thin-film transistor TFT.

A second interlayer insulating layer 107 may be on the storage capacitor Cst. The second interlayer insulating layer 107 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or a combination thereof, and may have a single-layered or multi-layered structure.

A first planarization layer 111 and a second planarization layer 113 may be on the second interlayer insulating layer 107. The first planarization layer 111 and the second planarization layer 113 may planarize an upper surface of the pixel circuit PC, so as to planarize a surface on which the organic light-emitting diode OLED is to be placed.

The first and second planarization layers 111 and 113 may include a general universal polymer (benzocyclobutene (BCB), polyimide, hexamethyldisiloxane (HMDSO), polymethylmethacrylate (PMMA), or polystyrene (PS)), polymer derivatives having phenol groups, acryl-based polymer, imide-based polymer, aryl ether-based polymer, amide-based polymer, fluoride-based polymer, p-xylene-based polymer, vinyl alcohol-based polymer, and blends thereof. The first and second planarization layers 111 and 113 may include an inorganic material. The first and second planarization layers 111 and 113 may include an insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$), or combinations thereof. In case that the first and second planarization layers 111 and 113 include the inorganic material, a chemical planarization polishing may be performed if necessary. On the other hand, the first planarization layer 111 and the second planarization layer 113 may include both an organic material and an inorganic material.

The lower driving voltage line PL may be on the first planarization layer 111. The lower driving voltage line PL may include aluminum (Al), copper (Cu), titanium (Ti), or the like, and may have a single-layered or multi-layered structure. In an embodiment, the lower driving voltage line PL may have a multi-layered structure including Ti/Al/Ti.

In FIG. 5B, a lower driving voltage line PL1 may be further provided under the first planarization layer 111. The lower driving voltage line PL1 may be electrically connected to the driving voltage line PL via a contact hole penetrating through the first planarization layer 111, and may prevent a voltage drop of the driving voltage ELVDD provided through the driving voltage line PL.

The lower driving voltage line PL1 may include a material that may be the same as that included in the data line DL. For example, the lower driving voltage line PL1 and the data line DL may include aluminum (Al), copper (Cu), titanium (Ti), or the like, and may have a single-layered or multi-layered structure. In an embodiment, the lower driving voltage line PL1 and the data line DL may have a multi-layered structure including Ti/Al/Ti or TiN/Al/Ti.

In an embodiment, the lower driving voltage line PL1 and the data line DL may be covered by a protective layer 109. The protective layer 109 may prevent wirings including metal such as aluminum, which may be damaged by an etchant, from being exposed to an etching environment during processes of manufacturing the display device 1. The protective layer 109 may extend to the peripheral area PA. In some cases, the protective layer 109 may be omitted.

In the display area DA of the substrate 100, a display device (e.g., the organic light-emitting diode OLED) may be on the second planarization layer 113, wherein the organic light-emitting diode OLED includes a pixel electrode 210, an intermediate layer 220, and an opposite electrode 230 facing the pixel electrode 210 with the intermediate layer 220 therebetween.

The pixel electrode 210 may be on the second planarization layer 113. The pixel electrode 210 may include a (semi-)transmissive electrode or a reflective electrode. In some embodiments, the pixel electrode 210 may include a reflective layer including Ag, Mg, Al, Pt, Pd, Au, Ni, Nd, Ir, Cr, and a compound thereof, and a transparent or semi-transparent electrode layer on the reflective layer. The transparent or semi-transparent electrode layer may include at least one electrode material selected from the group consisting of indium tin oxide (ITO), indium zinc oxide (IZO), zinc oxide (ZnO), indium oxide ($In_2O_3$), indium gallium oxide, and aluminum zinc oxide (AZO). In some embodiments, the pixel electrode 210 may include a stack structure including ITO/Ag/ITO.

A pixel defining layer 180 may be on the second planarization layer 113 and the pixel defining layer 180 may include an opening that exposes at least part of the pixel electrode 210 to define a light-emitting region of a pixel. Also, the pixel defining layer 180 may increase a distance between an edge of the pixel electrode 210 and an opposite electrode 230 on the pixel electrode 210 to prevent generation of arc at the edge of the pixel electrode 210. The pixel defining layer 180 may include, for example, an organic insulating material such as polyimide, polyamide, an acrylic resin, benzocyclobutene, hexamethyldisiloxane (HMDSO), and a phenol resin, and may be obtained by a spin coating, or the like.

A spacer 190 may be on the pixel defining layer 180. The spacer 190 may prevent damage to the organic light-emitting diode OLED due to sagging of a mask in a manufacturing process in which the mask may be used. The spacer 190 may include, for example, an organic insulating material such as polyimide, polyamide, an acrylic resin, benzocyclobutene, hexamethyldisiloxane (HMDSO), and a phenol resin, or a combination thereof, and may be obtained by spin coating, or the like. The spacer 190 may have a single-layered or multi-layered structure.

The intermediate layer 220 may be on the pixel electrode 210 that may be exposed via the pixel defining layer 180. The intermediate layer 220 may include a light-emitting layer, and functional layers such as a hole transport layer (HTL), a hole injection layer (HIL), an electron transport layer (ETL), and an electron injection layer (EIL) may be selectively arranged under and on the light-emitting layer.

The light-emitting layer may include an organic material including a fluorescent or phosphor material emitting red light, green light, blue light, or white light. The light-emitting layer may include low-molecular weight organic materials or polymer organic materials.

In case that the light-emitting layer includes a low-molecular weight organic material, the intermediate layer 220 may include an HIL, an HTL, an emission layer (EML), an ETL, and an EIL in a single or multiple-layered structure. Examples of the low-molecular weight material may include copper phthalocyanine (CuPc), N,N'-Di(naphthalene-1-yl)-N,N'-diphenyl-benzidine (NPB), and tris-8-hydroxyquinoline aluminum ($Alq_3$). The above layers may be manufactured, e.g., by a vacuum deposition method.

In case that the light-emitting layer includes a polymer organic material, the intermediate layer 220 may include an HTL and an EML. Here, the HTL may include PEDOT, and the EML may include a poly-phenylenevinylene (PPV)-based or polyfluorene-based polymer material. The light-emitting layer may be arranged by using a screen printing method, an inkjet printing method, a laser induced thermal imaging (LITI) method, or the like.

Pixel electrodes 210 may be arranged under the intermediate layer 220. The intermediate layer 220 may correspond to each of the pixel electrodes 210. However, embodiments are not limited thereto. The intermediate layer 220 may be variously modified. For example, the intermediate layer 220 may include a layer integrally provided throughout the pixel electrodes 210. In an embodiment, the intermediate layer 220 may correspond to each of the pixel electrodes 210, and functional layer(s) except the intermediate layer 220 may be provided integrally throughout the pixel electrodes 210.

The opposite electrode 230 may be on the intermediate layer 220. The opposite electrode 230 may be on the intermediate layer 220, and the opposite electrode 230 may entirely cover the intermediate layer 220.

The opposite electrode 230 may be arranged in the entire display area DA. For example, the opposite electrode 230 may be integrally provided to cover multiple pixels. The opposite electrode 230 may electrically contact a conductive layer 75 in the peripheral area PA. In an embodiment, the opposite electrode 230 may extend to a region adjacent to a first barrier wall PW1 as shown in FIG. 5B.

The opposite electrode 230 may include a transmissive electrode or a reflective electrode. In some embodiments, the opposite electrode 230 may be a transparent or a semi-transparent electrode, and may be provided as a metal thin film including Li, Ca, LiF/Ca, LiF/Al, Al, Ag, Mg, and a compound thereof having a small work function. A transparent conductive oxide (TCO) layer such as ITO, IZO, ZnO, or $In_2O_3$ may be further provided over the metal thin film.

In case that the pixel electrode 210 includes a reflective electrode and the opposite electrode 230 includes a transmissive electrode, light from the intermediate layer 220 may be emitted towards the opposite electrode 230 and the display device 1 may be a top emission type.

In an embodiment, in case that the pixel electrode 210 includes a transparent or a semi-transparent electrode and the opposite electrode 230 includes a reflective electrode, the light emitted from the intermediate layer 220 may be discharged towards the substrate 100 and the display device 1 may be a bottom emission type. However, embodiments are not limited thereto. For example, the display device 1 according to an embodiment may be a dual-emission type that emits light towards both the front and back surfaces.

The thin film encapsulation layer TFE may be on the opposite electrode 230 to protect the organic light-emitting diode OLED against external moisture and oxygen. The thin film encapsulation layer TFE may include at least one organic encapsulation layer and at least one inorganic encapsulation layer.

The thin film encapsulation layer TFE may cover (e.g., entirely cover) the display area DA and extend towards the peripheral area PA to partially cover the peripheral area PA. The thin film encapsulation layer TFE may extend to an outer side of a second barrier wall PW2.

The thin film encapsulation layer TFE may include a first inorganic encapsulation layer 310, a second inorganic encapsulation layer 330 above the first inorganic encapsulation layer, and an organic encapsulation layer 320 between the first inorganic encapsulation layer 310 and the second inorganic encapsulation layer 330.

The first inorganic encapsulation layer 310 and the second inorganic encapsulation layer 330 in the thin film encapsulation layer TFE may extend to the outer side of the second barrier wall PW2, and the organic encapsulation layer 320 in the thin film encapsulation layer TFE may not extend to the outer side of the second barrier wall PW2. The first inorganic encapsulation layer 310 and the second inorganic encapsulation layer 330 may contact each other on the first barrier wall PW1.

The first and second inorganic encapsulation layers 310 and 330 may include one or more inorganic materials from aluminum oxide, titanium oxide, tantalum oxide, hafnium oxide, zinc oxide, silicon oxide, silicon nitride, and silicon oxynitride. The first inorganic encapsulation layer 310 and the second inorganic encapsulation layer 330 may each have a single-layered structure or a multi-layered structure including the above-mentioned materials. The first inorganic encapsulation layer 310 and the second inorganic encapsulation layer 330 may include the same material as or different materials from each other.

The first inorganic encapsulation layer 310 and the second inorganic encapsulation layer 330 may have different thicknesses or the same thickness. For example, the thickness of the first inorganic encapsulation layer 310 may be greater than that of the second inorganic encapsulation layer 330. As another example, the thickness of the second inorganic encapsulation layer 330 may be greater than that of the first inorganic encapsulation layer 310. As another example, the first inorganic encapsulation layer 310 and the second inorganic encapsulation layer 330 may have the same thickness.

The organic encapsulation layer 320 may include a monomer-based material or a polymer-based material. The organic encapsulation layer 320 may include polyethylene terephthalate, polyethylene naphthalate, polycarbonate, polyimide, polyethylene sulfonate, polyoxymethylene, polyarylate, hexamethyl disiloxane, an acryl-based resin (e.g., polymethyl methacrylate, polyacrylic acid, or the like), or a combination thereof.

A touch part may be on the thin film encapsulation layer TFE. The touch part may include a first touch insulating layer 510, a first conductive layer 520 on the first touch insulating layer 510, a second conductive layer 540 over the first conductive layer 520, a second touch insulating layer 530 between the first conductive layer 520 and the second conductive layer 540, and a second organic material layer 550 on the second conductive layer 540.

The first conductive layer 520 may include first sensing electrodes and the second conductive layer 540 may include second sensing electrodes. In an embodiment, the first conductive layer 520 and the second conductive layer 540 may each have a mesh shape so as not to be visible to a user, and may each have a triple-layered structure including titanium/aluminum/titanium.

The first conductive layer 520 and the second conductive layer 540 may each have a single-layered structure or a multi-layered structure. The conductive layer of a single-layered structure may include a metal layer or a transparent conductive layer. The metal layer may include molybdenum, silver, titanium, copper, aluminum, and alloys thereof. The transparent conductive layer may include a transparent conductive oxide material such as indium tin oxide (ITO), indium zinc oxide (IZO), zinc oxide (ZnO), indium tin zinc oxide (ITZO), or the like. The transparent conductive layer may include a conductive polymer such as PEDOT, metal nano-wires, graphene, or the like. The conductive layer of a multi-layered structure may include multiple metal layers. The multiple metal layers may have, for example, a triple-layered structure of Ti/Al/Ti. The conductive layer of the multi-layered structure may include at least one metal layer and at least one transparent conductive layer.

Each of the first touch insulating layer 510 and the second touch insulating layer 530 may have a single-layered or multi-layered structure. Each of the first touch insulating layer 510 and the second touch insulating layer 530 may include an inorganic material, an organic material, or a composite material. In another embodiment, at least one of the first touch insulating layer 510 and the second touch insulating layer 530 may include an inorganic layer. The inorganic layer may include at least one selected from aluminum oxide, titanium oxide, silicon oxide, silicon oxynitride, zirconium oxide, and hafnium oxide.

In another embodiment, at least one of the first touch insulating layer 510 and the second touch insulating layer 530 may include an organic layer. The organic layer may include at least one selected from an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

The second organic material layer 550 may be on the second conductive layer 540. The second organic material layer 550 may extend to the corner area CA so as to cover a first organic material layer 114 that will be described later. The second organic material layer 550 may include at least one selected from an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

The touch part may sense an external input, for example, in a capacitive manner. However, the operating manner of the touch part is not limited to the above example, and the touch part TU of an embodiment may sense the external input by, e.g., an electromagnetic induction method or a pressure sensing method.

Referring to FIG. 5B, dummy pixels DPX may be provided neighboring with the organic light-emitting diode OLED. The dummy pixels DPX may not actually emit light, and may include, for example, a patterned intermediate layer. The dummy pixels DPX may be between the display area DA and a driving circuit area DPC-A.

The driving circuit area DPC-A may be on the peripheral area PA. For example, a second scan driving circuit 120 may be in the driving circuit area DPC-A. The second scan driving circuit 120 may include thin-film transistors TFT-P and wirings (not shown) connected to the thin-film transistors TFT-P. The thin-film transistor TFT-P may be manufactured through the same manufacturing process of the thin-film transistor TFT of the pixel circuit PC. The inorganic layer 101, the gate insulating layer 103, the first interlayer insulating layer 105, the second interlayer insulating layer 107, and the protective layer 109 may extend to the peripheral area PA. The inorganic layer 101, the gate insulating layer 103, the first interlayer insulating layer 105, the second interlayer insulating layer 107, and the protective layer 109 may include an inorganic insulating material.

The second scan driving circuit 120 may be covered with the protective layer 109. The protective layer 109 may prevent wirings including metal such as aluminum, which may be damaged by an etchant, from being exposed to an etching environment during processes of manufacturing the display device 1.

The protective layer 109 may include an inorganic material, such as silicon oxide ($SiO_x$), silicon nitride ($SiN_x$), and/or silicon oxynitride (SiON), and may have a single-layered or multi-layered structure. In an embodiment, the protective layer 109 may include silicon nitride ($SiN_x$). The protective layer 109 may have a thickness of about 500 Å to about 10,000 Å. The first planarization layer 111, the second planarization layer 113, and the pixel defining layer 180 extending from the display area DA may be on the protective layer 109.

The first barrier wall PW1 and the second barrier wall PW2 may be over the substrate 100 of the peripheral area PA. The first barrier wall PW1 may surround the display area DA and the second barrier wall PW2 may surround the first barrier wall PW1.

The second power supply line 170 may be over the substrate 100 in the peripheral area PA. The second power supply line 170 may provide the second power voltage ELVSS to the opposite electrode 230 of each pixel P. A second connecting line 171 may be on the second power supply line 170. The second power supply line 170 may be connected to the conductive layer 75 via the second connecting line 171 to provide the opposite electrode 230 with the second power voltage ELVSS. The conductive layer 75 may be over the second connecting line 171. The conductive layer 75 may be in contact with the second connecting line 171 via an end portion thereof to provide the second power voltage ELVSS to the opposite electrode 230.

The first barrier wall PW1 may be over the second power supply line 170 and the second connecting line 171 may be on the second power supply line 170. The second barrier wall PW2 may be on an outer side of the second power supply line 170. The first barrier wall PW1 and the second barrier wall PW2 may prevent overflow of the organic material forming the organic encapsulation layer 320 to the outer side of the substrate 100.

Wirings 147 may be on a region of the substrate 100, wherein the region corresponds to the second barrier wall PW2. The wirings 147 may include the same material as that of the upper electrode 146. The wirings 147 and the upper electrode 146 may include the same material. The wirings 147 may be arranged simultaneously with the upper electrode 146 through the same process.

Referring to FIG. 5A, in the display device 1 according to an embodiment, the substrate 100 may include the corner area CA that may be rounded and adjacent to the first bending display area BA1 and the second bending display area BA2, and the inorganic layer 101 on the substrate 100 may include an opening pattern OP, at least part of which may be removed to correspond to the corner area CA. The opening pattern OP may have a slit shape corresponding to the corner area CA.

Referring to FIG. 5B, the first organic material layer 114 may be on the substrate 100, on which at least part of the inorganic layer 101 may be removed to correspond to the corner area CA. In an embodiment, the first organic material layer 114 may be on (e.g., directly on) the substrate 100, on which at least part of the inorganic layer 101 may be removed to correspond to the corner area CA. The first organic material layer 114 may include the same material as that of the second planarization layer 113 described above. The first organic material layer 114 and the second planarization layer 113 may include the same material.

The first organic material layer 114 may be on the opening pattern OP in which at least part of the inorganic layer 101 is removed to correspond to the corner area CA, and prevents propagation of cracks generated in the corner area CA into the display device.

A second organic material layer 550 may be on the first organic material layer 114. The second organic material layer 550 may be in the display area DA and may extend to the corner area CA to at least partially cover the first organic material layer 114.

The display device according to the embodiment may further include a first dam portion DM1 corresponding to the corner area CA and surrounding an outer portion of the opening pattern OP. The first dam portion DM1 may include a first layer 104, a second layer 106, and a third layer 108. The first layer 104 of the first dam portion DM1 may be on the inorganic layer 101, the second layer 106 may be on the first layer 104, and the third layer 108 may be on the second layer 106.

The first layer 104 of the first dam portion DM1 may include the same material as that of the gate insulating layer 103 in the display area DA, the second layer 106 of the first dam portion DM1 may include the same material as that of the first interlayer insulating layer 105 in the display area DA, and the third layer 108 of the first dam portion DM1 may include the same material as that of the second interlayer insulating layer 107 in the display area DA. In another embodiment, the first layer 104, the second layer 106, and the third layer 108 of the first dam portion DM1 may include an inorganic material, and an inorganic material may not be on the outer portion of the first dam portion DM1, except for the inorganic layer 101.

The first dam portion DM1 may further include the first organic material layer 114. The first organic material layer 114 may cover the first layer 104, the second layer 106, and the third layer 108 that may be sequentially on the inorganic layer 101. In an embodiment, the first organic material layer 114 covering at least part of the opening pattern OP may extend to cover the first layer 104, the second layer 106, and the third layer 108 of the first dam portion DM1. In an embodiment, the opening pattern OP and the first dam portion DM1 may be apart from each other, and thus the first organic material layer 114 covering at least part of the opening pattern OP and the first organic material layer 114 of the first dam portion DM1 may be apart from each other.

Referring to FIG. 5C, one or more insulating layers ILL may be on the inorganic layer 101, to correspond to the corner area CA. The insulating layers ILL may include a first insulating layer ILL1, a second insulating layer ILL2, and a third insulating layer ILL3. The first insulating layer ILL1 may be on the inorganic layer 101 to correspond to the corner area CA, the second insulating layer ILL2 may be on the first insulating layer ILL1, and the third insulating layer ILL3 may be on the second insulating layer ILL2.

The first insulating layer ILL1 may include the same material as that of the gate insulating layer 103 over the display area DA, the second insulating layer ILL2 may include the same material as that of the first interlayer insulating layer 105 in the display area DA, and the third insulating layer ILL3 may include the same material as that of the second interlayer insulating layer 107 in the display area DA.

Referring to FIG. 5D, the opening pattern OP in which at least part of the inorganic layer 101 may be removed to correspond to the corner area CA according to the embodiment may be repeatedly arranged with the at least one insulating layer ILL on the inorganic layer 101 to correspond to the corner area CA, as a slit structure.

Figure 6A:
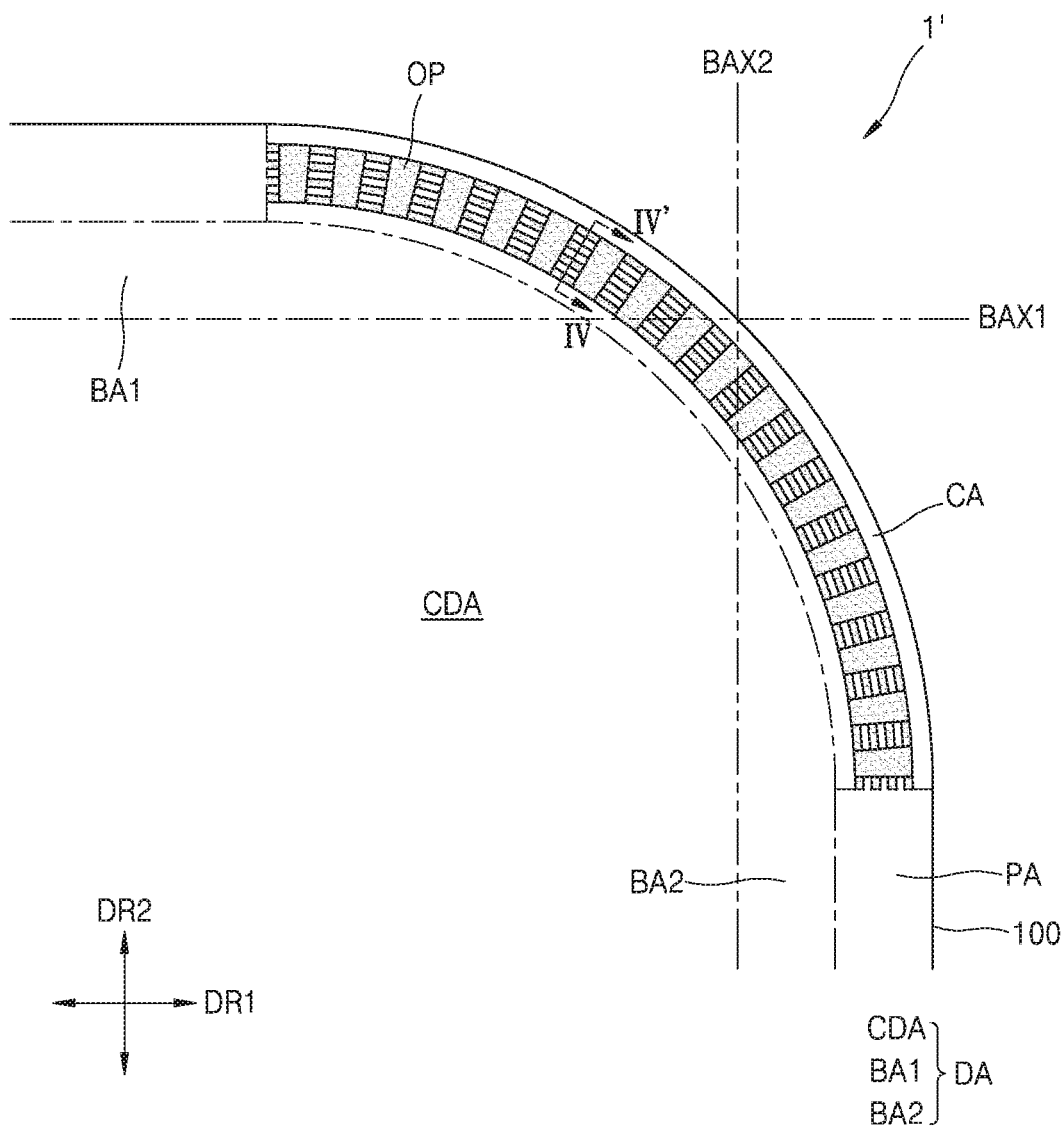
FIGS. 6A and 6B are schematic diagrams illustrating part of a display device according to an embodiment.
Figure 6B:
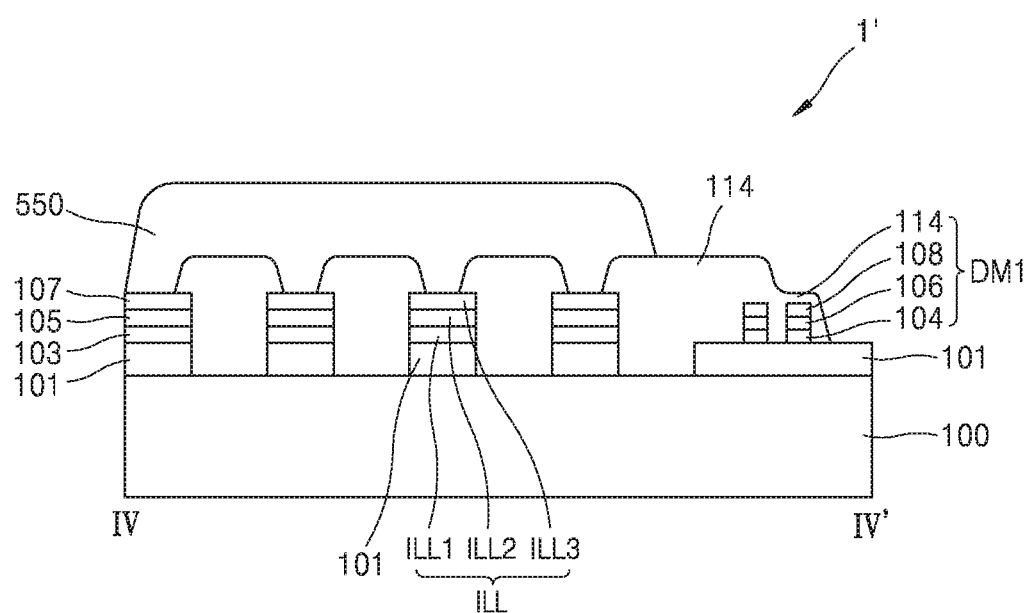

FIGS. 6A and 6B are schematic diagrams illustrating part of a display device 1' according to an embodiment. In detail, FIG. 6A is an enlarged schematic view of the corner area CA in the display device 1', and FIG. 6B is a schematic cross-sectional view of the display device 1' taken along line IV-IV' of FIG. 6A.

Referring to FIGS. 6A and 6B, the display device 1' according to an embodiment may include a substrate 100, an inorganic layer 101, and a first organic material layer 114. The substrate 100 may include a display area DA and a peripheral area PA on the outer portion of the display area DA. The display area DA may include a central display area CDA, the first bending display area BA1 that may be in contact with the central display area CDA and bent about the first bending axis BAX1, and the second bending display area BA2 bent about the second bending axis BAX2 that intersects with the first bending axis BAX1. The peripheral area PA may include the corner area CA that may have a rounded shape adjacent to the first bending display area BA1 and the second bending display area BA2. The inorganic layer 101 may be provided throughout the display area DA and the peripheral area PA, and may include the opening pattern OP. At least part of the inorganic layer 101 may be removed to correspond to the corner area CA. The first organic material layer 114 at least partially covers the opening pattern OP. The opening pattern OP in which at least part of the inorganic layer 101 may be removed may have a grating structure corresponding to the corner area CA.

Figure 7A:
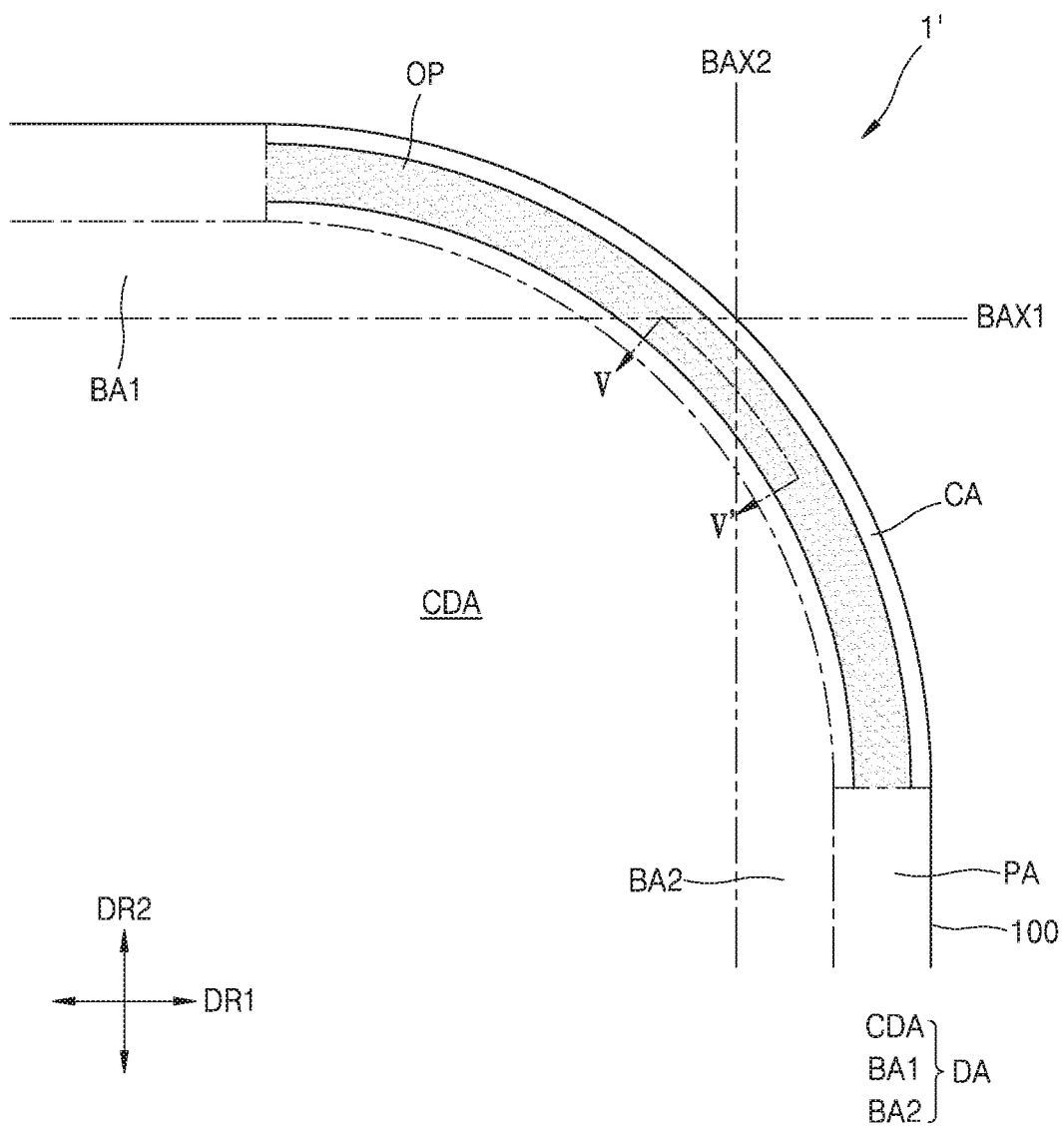
FIGS. 7A and 7B are schematic diagrams illustrating part of a display device according to an embodiment.
Figure 7B:
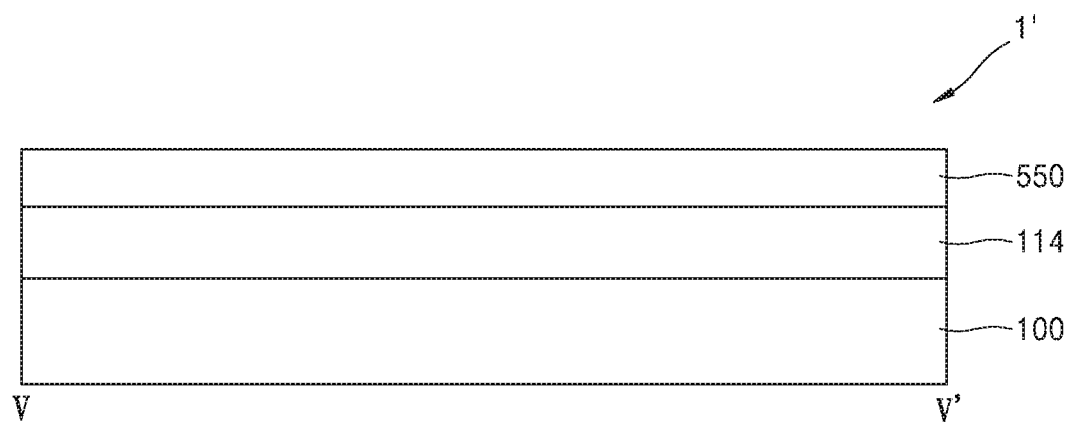

FIGS. 7A and 7B are schematic diagrams illustrating part of a display device 1' according to an embodiment. In detail, FIG. 7A is an enlarged view of a corner area CA in a display device 1't, and FIG. 7B is a cross-sectional view of the display device 1' taken along line V-V of FIG. 7A.

Referring to FIGS. 7A and 7B, the display device 1' according to an embodiment may include an inorganic layer 101 including opening pattern OP that may be provided throughout the display area DA and a peripheral area PA and At least part of the inorganic layer 101 may be removed to correspond to the corner area CA. The opening pattern OP in which at least part of the inorganic layer 101 may be removed may be along a circumference of the corner area CA as a band to correspond to the corner area CA.

In an embodiment, the substrate 100 may include the corner area CA that may be rounded and adjacent to the first bending area corresponding to the first bending display area BA1 and the second bending area corresponding to the second bending display area BA2. The inorganic layer 101 on the substrate 100 may have the opening pattern OP, at least part of which may be removed to correspond to the corner area CA. The opening pattern OP may have at least one selected from the slit structure, the grating structure, and the band structure corresponding to the corner area CA.

Figure 8A:
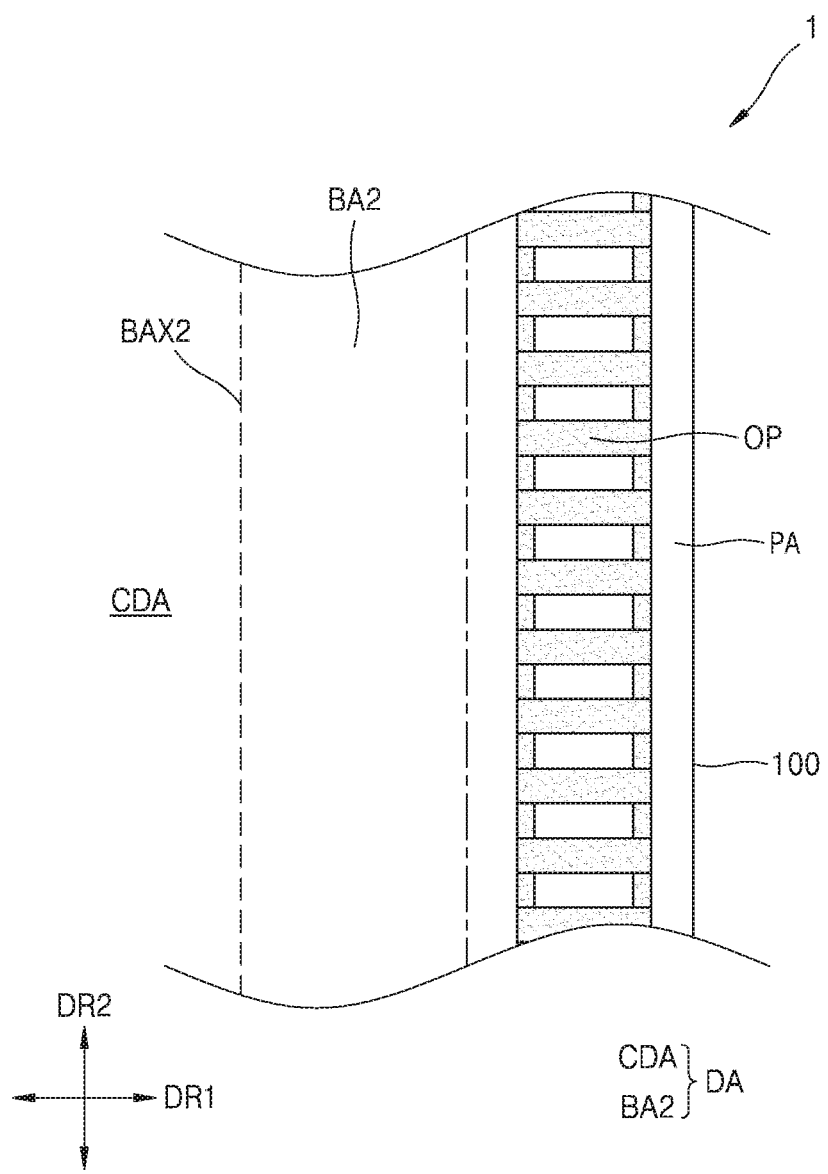
FIGS. 8A to 8C are schematic diagrams illustrating a display device according to an embodiment.
Figure 8B:
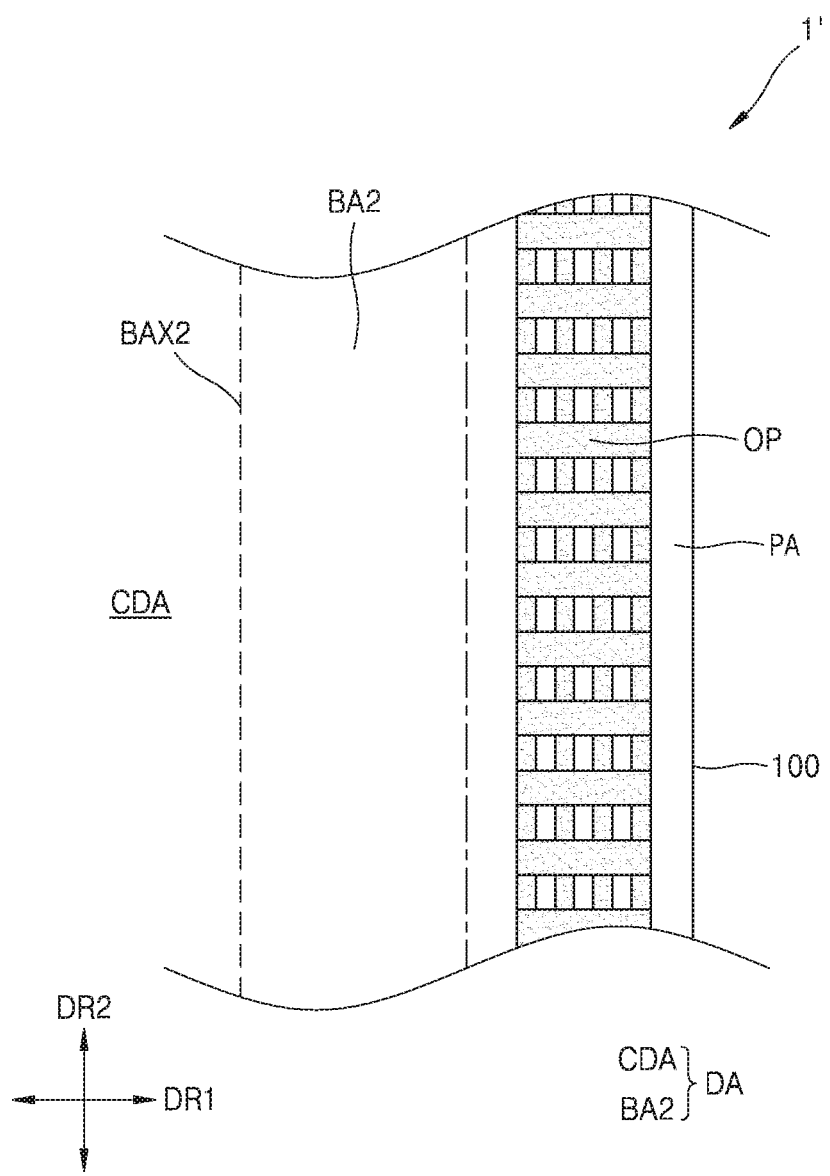
Figure 8C:
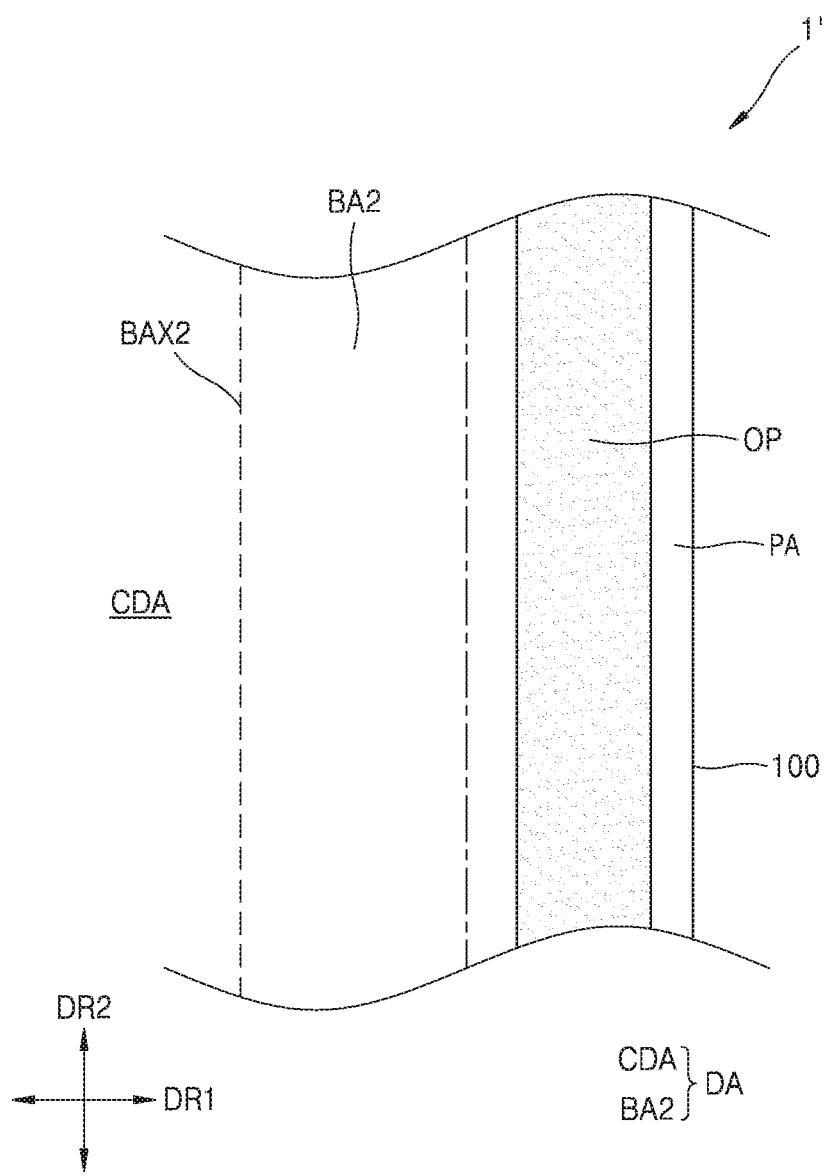

FIGS. 8A to 8C are schematic diagrams for illustrating display devices 1 and 1' according to embodiments. In detail, FIG. 8A shows that an opening pattern OP may have a slit structure corresponding to a peripheral area PA. FIG. 8B shows that an opening pattern OP may have a grating structure corresponding to a peripheral area PA. FIG. 8C shows that an opening pattern OP may have a band shape corresponding to a peripheral area PA.

Referring to FIGS. 8A to 8C, in a display device according to an embodiment, an opening pattern OP may extend in a first direction DR1 and a second direction DR2 to correspond to a peripheral area PA, as well as a corner area CA. In an embodiment, as shown in FIG. 8A, the opening pattern OP may have the slit structure corresponding to the peripheral area PA. As shown in FIG. 8B, the opening pattern OP may have the grating structure corresponding to the peripheral area PA. As shown in FIG. 8C, the opening pattern OP may have the band structure corresponding to the peripheral area PA.

In FIGS. 8A to 8C, the opening pattern OP may be formed to correspond to only part of the peripheral area PA. However, the opening pattern OP may entirely correspond to the peripheral area PA while surrounding the display area DA.

In a display device according to the related art, cracks generated in a peripheral area PA may propagate to a display area DA, and thus, an organic light-emitting diode OLED, a touch part TU, and the like, may be damaged.

Therefore, in order to address the above issue, the opening pattern OP in which at least part of the inorganic layer 101 may be removed to correspond to the corner area CA to prevent propagation of cracks, and a display device having improved reliability may be provided.

Figure 9:
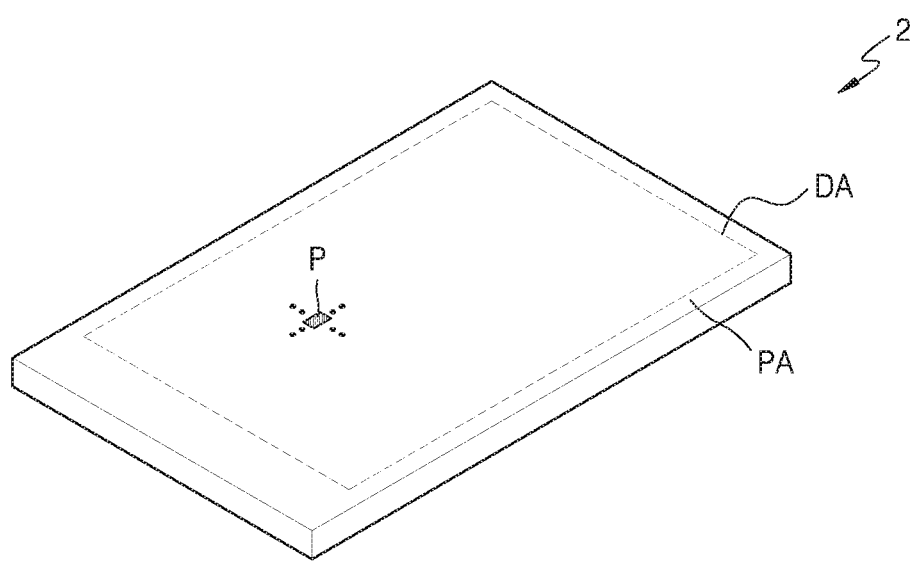
FIG. 9 is a schematic perspective view of a display device according to an embodiment.

FIG. 9 is a schematic perspective view of a display device 2 according to an embodiment.

Referring to FIG. 9, the display device 2 may include the display area DA and the peripheral area PA, wherein the display area DA displays images and the peripheral area PA does not display images. The display device 2 may provide images by using light emitted from the display area DA.

In FIG. 9, the display device 2 may include the display area DA having a square shape, but embodiments are not limited thereto. The display area DA may have a circular shape, an elliptical shape, or a polygonal shape such as a triangle, a pentagon, or the like. Also, the display device 2 of FIG. 9 may include a flat panel display device, but the display device 2 may be implemented as various types, e.g., a flexible display device, a foldable display device, a rollable display device, or the like.

Figure 10A:
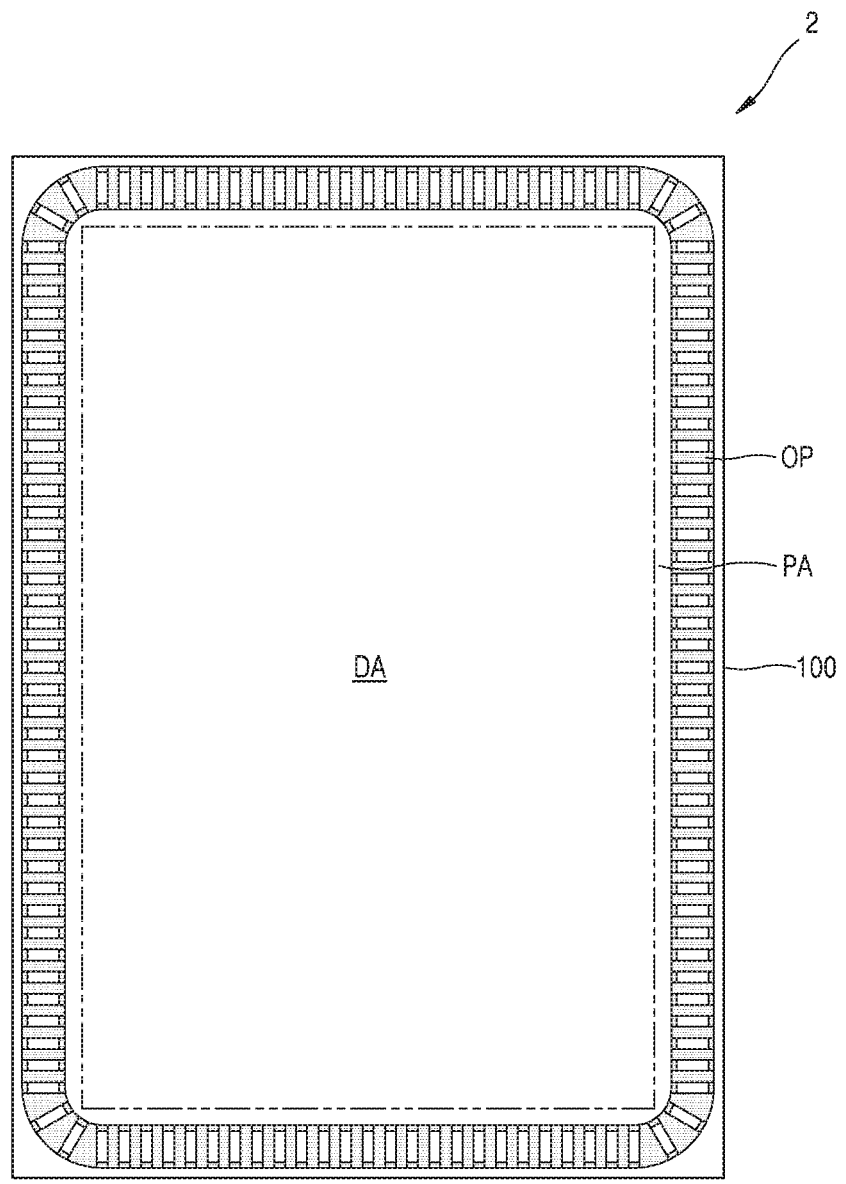
FIGS. 10A to 10C are schematic plan views of a display device according to an embodiment.
Figure 10B:
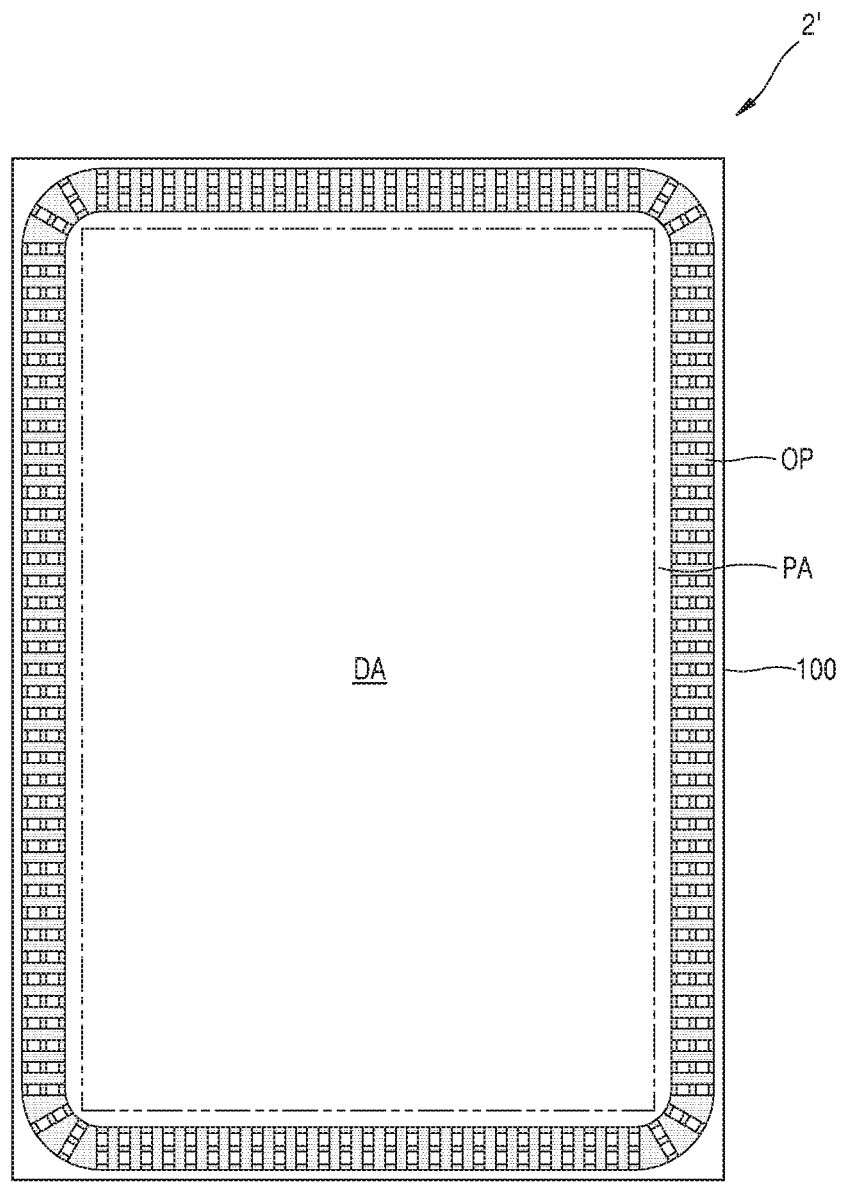
Figure 10C:
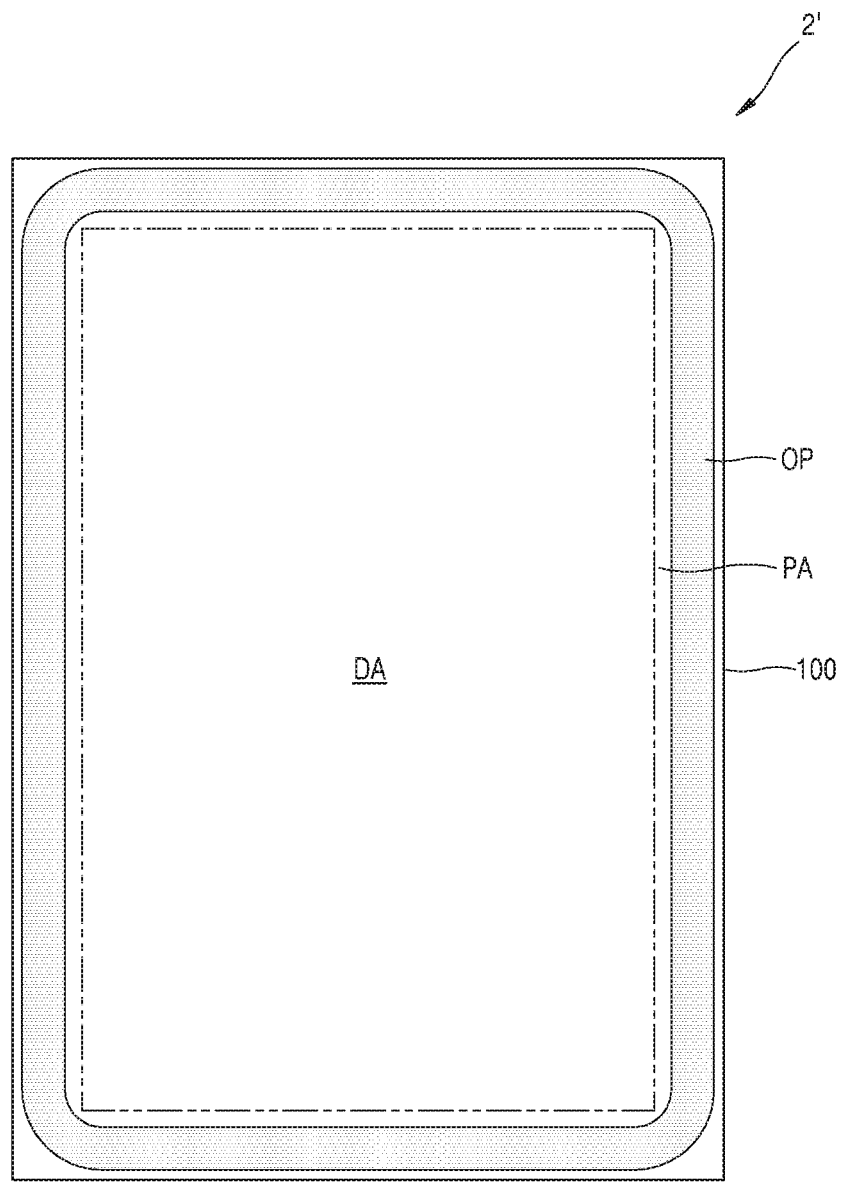

FIGS. 10A to 10C are schematic plan views of display devices 2 and 2' according additional embodiments. In detail, FIG. 10A shows an opening pattern OP that may have a slit structure corresponding to a peripheral area PA. FIG. 10B shows an opening pattern OP that may have a grating structure corresponding to a peripheral area PA. FIG. 10C shows an opening pattern OP that may have a band shape corresponding to a peripheral area PA.

FIGS. 10A to 10C are schematic plan views of the display device 2 and 2' according to embodiments. Although FIG. 10A shows the display area DA and the peripheral area PA having different shapes as those of FIG. 5A, the elements in FIG. 5B may also be included on the substrate 100 in FIG. 10A. The substrate 100 in FIG. 10A may be flexible. FIG. 10B may include the same elements as those in FIG. 5B, except for the shapes of the display area DA and the peripheral area PA as compared with FIG. 6A. FIG. 10C may include the same elements as those in FIG. 5B, except for the shapes of the display area DA and the peripheral area PA as compared with FIG. 7A.

The display device 2 according to an embodiment may include the flexible substrate 100 including the display area DA and the peripheral area PA on the outer portion of the display area DA. The display device 2 may include an inorganic layer on the flexible substrate 100, wherein the inorganic layer may include an opening pattern OP where at least part of the inorganic layer may be removed to correspond to the peripheral area PA. The display device may include at least one insulating layer on the inorganic layer to correspond to the peripheral area PA, and a first organic material layer on the flexible substrate 100. The first organic material layer may at least partially cover the opening pattern OP. In an another embodiment, the first organic material layer may be on (e.g., directly on) the flexible substrate 100.

The display device 2 according to an embodiment may further include thin-film transistors on the flexible substrate 100, a first planarization layer on the thin-film transistors to cover the thin-film transistors, and a second planarization layer on the first planarization layer. The second planarization layer may include the same material as that of the first organic material layer.

As shown in FIG. 10A, the opening pattern OP may be provided to have a slit structure along the display area DA to correspond to the peripheral area PA. As shown in FIG. 10B, the opening pattern OP may have a grating structure along the display area DA to correspond to the peripheral area PA. As shown in FIG. 10C, the opening pattern OP may have a band structure along the display area DA to correspond to the peripheral area PA.

Figure 11A:
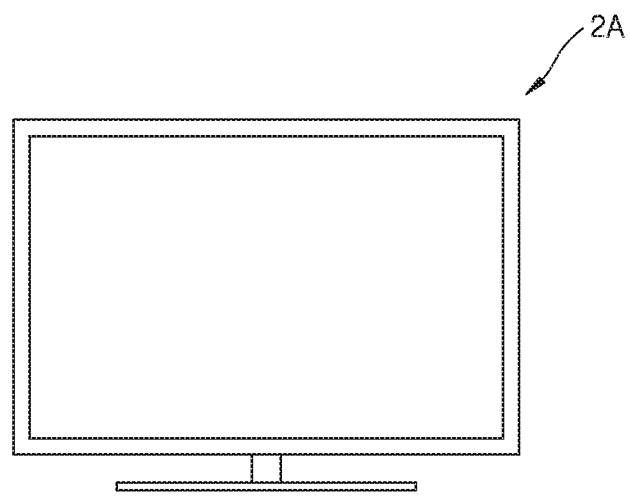
FIGS. 11A to 11C are schematic diagrams of electronic devices to which a display according to an embodiment may be applied.
Figure 11B:
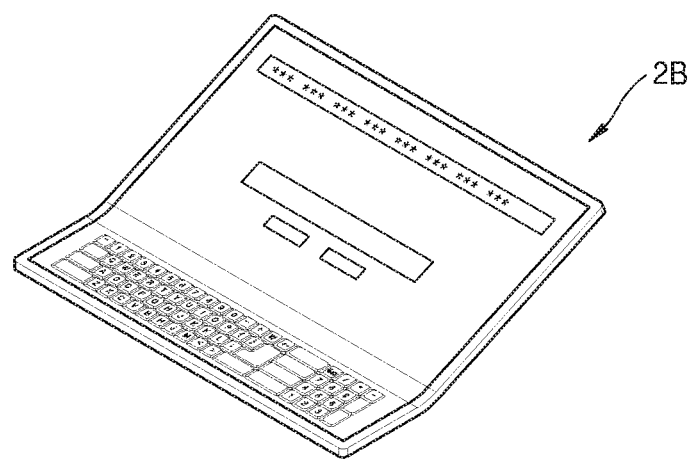
Figure 11C:
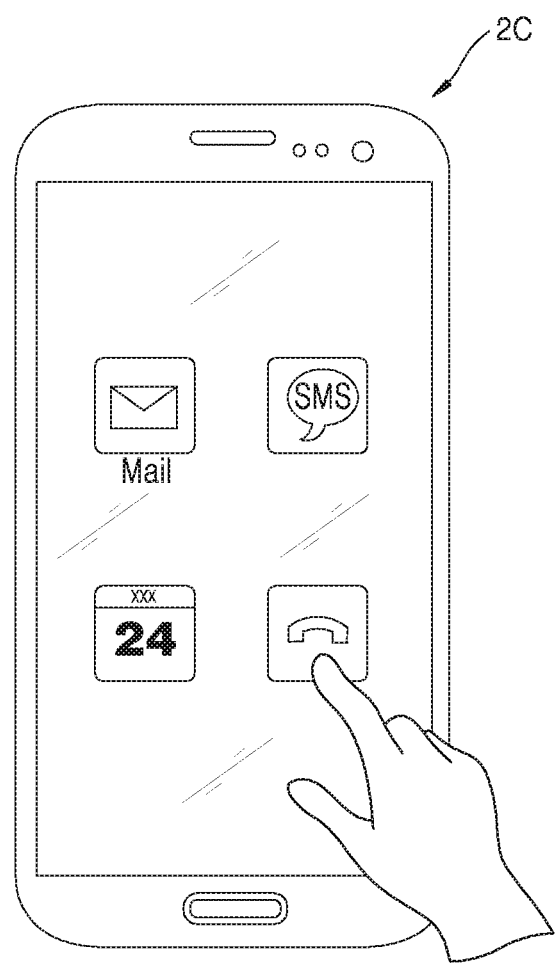

FIGS. 11A to 11C are schematic diagrams of electronic devices to which a display according to an embodiment may be applied.

The display device 2 having the above-described structure may be applied to a television 2A as shown in FIG. 11A, a laptop computer or a foldable tablet personal computer (PC) 2B as shown in FIG. 11B, or a portable display device 2C such as a mobile phone as shown in FIG. 11C. As another example, the display device according to embodiments may be any kind of electronic device provided that the electronic device may provide images, for example, a display portion included in an artificial intelligence speaker.

According to an embodiment, in order to address damage to a display device due to the propagation of cracks generated in a peripheral area in the display device according to the related art, an opening pattern may be provided on the peripheral area to prevent the propagation of the cracks and to provide the display device having improved reliability.

Display devices have been described, but the disclosure is not limited thereto. For example, a method of manufacturing the display device may be also included in the scope of the disclosure.

According to an embodiment, the opening pattern may be provided in the peripheral area, and thus the propagation of the cracks may be prevented and the display device having improved reliability may be implemented. However, the scope of the disclosure is not limited to the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:
a substrate comprising:
    a display area including:
        a central display area;
        a first bending display area contacting the central display area and bent about a first bending axis; and
        a second bending display area bent about a second bending axis intersecting the first bending axis; and
    a peripheral area outside the display area, the peripheral area including:
        a corner area rounded and adjacent to the first bending display area and the second bending display area;
an inorganic layer disposed at the display area and the peripheral area;
an opening pattern formed in the inorganic layer and corresponding to the corner area;
a first organic material layer covering the opening pattern; and
a first dam portion corresponding to the corner area, the first dam portion surrounding the opening pattern, wherein
the first organic material layer is disposed on the first dam portion, and
the opening pattern is arranged in a band structure along the periphery of the corner area.

2. The display device of claim 1, wherein a portion of the inorganic layer is removed to form the opening pattern.

3. The display device of claim 2, wherein the first organic material layer is directly on a portion of the substrate from which the portion of the inorganic layer is removed.

4. The display device of claim 1, wherein the opening pattern has a slit structure corresponding to the corner area.

5. The display device of claim 1, wherein the opening pattern has a grating structure corresponding to the corner area.

6. The display device of claim 1, further comprising
an insulating layer including an inorganic material and disposed on the inorganic layer in the display area and the peripheral area,
wherein the first dam portion includes a portion of the insulating layer.

7. The display device of claim 1, further comprising:
thin-film transistors on the inorganic layer at the central display area, the first bending display area, and the second bending display area; and
display elements electrically connected to the thin-film transistors.

8. The display device of claim 7, further comprising:
a first planarization layer disposed on the thin-film transistors; and
a second planarization layer disposed on the first planarization layer.

9. The display device of claim 8, wherein the first organic material layer and the second planarization layer include a same material.

10. The display device of claim 7, further comprising a thin-film encapsulation layer disposed on the display elements, the thin-film encapsulation layer comprising an inorganic encapsulation layer and an organic encapsulation layer.

11. The display device of claim 10, further comprising a touch part on the thin-film encapsulation layer, the touch part comprising:
a first touch insulating layer;
a first conductive layer on the first touch insulating layer;
a second conductive layer on the first conductive layer;
a second touch insulating layer between the first conductive layer and the second conductive layer; and
a second organic material layer on the second conductive layer.

12. The display device of claim 11, wherein the second organic material layer extends to the corner area and covers the first organic material layer.

13. The display device of claim 1, wherein the substrate further comprises a third bending display area contacting the central display area and bent about a third bending axis.

14. The display device of claim 13, wherein the substrate further comprises a fourth bending display area contacting the central display area and bent about a fourth bending axis.

15. A display device comprising:
a substrate comprising:
a display area;
a first bending area contacting the display area and bent about a first bending axis;
a second bending area bent about a second bending axis intersecting with the first bending axis; and
a peripheral area located outside the display area, the peripheral area including a corner area rounded and adjacent to the first bending area and the second bending area;
an inorganic layer disposed at the display area and the peripheral area;
an opening pattern formed in the inorganic layer and corresponding to the corner area;
a first organic material layer covering the opening pattern; and
a first dam portion corresponding to the corner area, the first dam portion surrounding the opening pattern, wherein
the first organic material layer is disposed on the first dam portion, and
the opening pattern is arranged in a band structure along the periphery of the corner area.

16. The display device of claim 15, wherein a portion of the inorganic layer is removed to form the opening pattern.

17. The display device of claim 16, wherein the first organic material layer is directly on a portion of the substrate from which the portion of the inorganic layer is removed.

18. The display device of claim 15, wherein the opening pattern has a slit structure corresponding to the corner area.

19. The display device of claim 15, wherein the opening pattern has a grating structure corresponding to the corner area.

* * * * *